US010748923B2

(12) United States Patent
Son et al.

(10) Patent No.: US 10,748,923 B2
(45) Date of Patent: Aug. 18, 2020

(54) VERTICAL MEMORY DEVICES AND METHODS OF MANUFACTURING THE SAME

(71) Applicant: Samsung Electronics Co., Ltd., Suwon-si, Gyeonggi-do (KR)

(72) Inventors: Young-Hwan Son, Hwaseong-si (KR); Kohji Kanamori, Seongnam-si (KR); Shin-Hwan Kang, Seoul (KR); Young Jin Kwon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/209,323

(22) Filed: Dec. 4, 2018

(65) Prior Publication Data

US 2019/0326316 A1  Oct. 24, 2019

(30) Foreign Application Priority Data

Apr. 20, 2018 (KR) ........................ 10-2018-0046048

(51) Int. Cl.
*H01L 27/115* (2017.01)
*H01L 23/535* (2006.01)
(Continued)

(52) U.S. Cl.
CPC ...... *H01L 27/11582* (2013.01); *H01L 23/535* (2013.01); *H01L 27/11573* (2013.01)

(58) Field of Classification Search
CPC .. H01L 27/11582; H01L 27/11; H01L 27/115; H01L 27/11548; H01L 27/11573; H01L 23/53; H01L 23/535
(Continued)

(56) References Cited

U.S. PATENT DOCUMENTS 8,476,713 B2  7/2013 Lee et al.
8,765,598 B2  7/2014 Smith et al.
(Continued)

FOREIGN PATENT DOCUMENTS

JP  2015-0056452 A  3/2015
KR  20160013756 A  2/2016
(Continued)

OTHER PUBLICATIONS

Partial Search Report for corresponding European Application No. 18210705.2 dated Jul. 31, 2019.
(Continued)

*Primary Examiner* — Fazli Erdem
(74) *Attorney, Agent, or Firm* — Harness, Dickey and Pierce, P.L.C.

(57) ABSTRACT

A vertical memory device includes gate electrodes on a substrate, a channel extending through the gate electrodes, and a contact plug extending through the gate electrodes. The gate electrodes are stacked in a first direction substantially vertical to an upper surface of the substrate and arranged to have a staircase shape including steps of which extension lengths in a second direction substantially parallel to the upper surface gradually increase from a lowermost level toward an uppermost level. A pad at an end portion of each of the gate electrodes in the second direction has a thickness greater than those of other portions thereof. The channel extends in the first direction. The contact plug extends in the first direction. The channel contacts the pad of a first gate electrode among the gate electrodes to be electrically connected thereto, and is electrically insulated from second gate electrodes among the gate electrodes.

19 Claims, 33 Drawing Sheets

(51) Int. Cl.
*H01L 27/11582* (2017.01)
*H01L 27/11573* (2017.01)

(58) Field of Classification Search
USPC ........................................................ 257/324
See application file for complete search history.

(56) References Cited

U.S. PATENT DOCUMENTS

| | | | |
|---|---|---|---|
| 9,029,938 B2 | 5/2015 | Nakaki | |
| 9,524,903 B2 | 12/2016 | Lee | |
| 9,595,533 B2 | 3/2017 | Tanzawa et al. | |
| 9,768,233 B1 | 9/2017 | Fukuda et al. | |
| 9,853,038 B1* | 12/2017 | Cui | H01L 27/11565 |
| 9,871,053 B2 | 1/2018 | Kwak | |
| 9,875,931 B2 | 1/2018 | Lee et al. | |
| 9,876,031 B1 | 1/2018 | Shimizu et al. | |
| 2015/0069499 A1 | 3/2015 | Nakaki | |
| 2015/0287710 A1* | 10/2015 | Yun | H01L 27/1157 257/314 |
| 2015/0340370 A1* | 11/2015 | Kim | H01L 27/11578 365/185.18 |
| 2015/0372000 A1* | 12/2015 | Jee | H01L 27/11573 257/314 |
| 2016/0027730 A1 | 1/2016 | Lee | |
| 2016/0064281 A1 | 3/2016 | Izumi et al. | |
| 2016/0268264 A1* | 9/2016 | Hwang | H01L 27/11578 |
| 2017/0011996 A1 | 1/2017 | Lee et al. | |
| 2017/0084532 A1 | 3/2017 | Son et al. | |
| 2017/0271354 A1 | 9/2017 | Kwak | |
| 2017/0287926 A1 | 10/2017 | Ariyoshi | |
| 2017/0323900 A1* | 11/2017 | Kanamori | H01L 27/11582 |
| 2018/0122695 A1 | 5/2018 | Lee et al. | |
| 2019/0035805 A1* | 1/2019 | Lee | H01L 27/11582 |

FOREIGN PATENT DOCUMENTS

| | | |
|---|---|---|
| KR | 20170005660 A | 1/2017 |
| KR | 20170107195 A | 9/2017 |
| WO | WO-2014/036294 A1 | 3/2014 |

OTHER PUBLICATIONS

Extended European Search Report dated Oct. 18, 2019 for European Patent Application No. 18210705.2.
Intellectual Property Office of Singapore Written Opinion dated Aug. 22, 2019 and Search Report dated Aug. 20, 2019 for Singapore Patent Application No. 10201900586 V.

* cited by examiner

FIG. 15
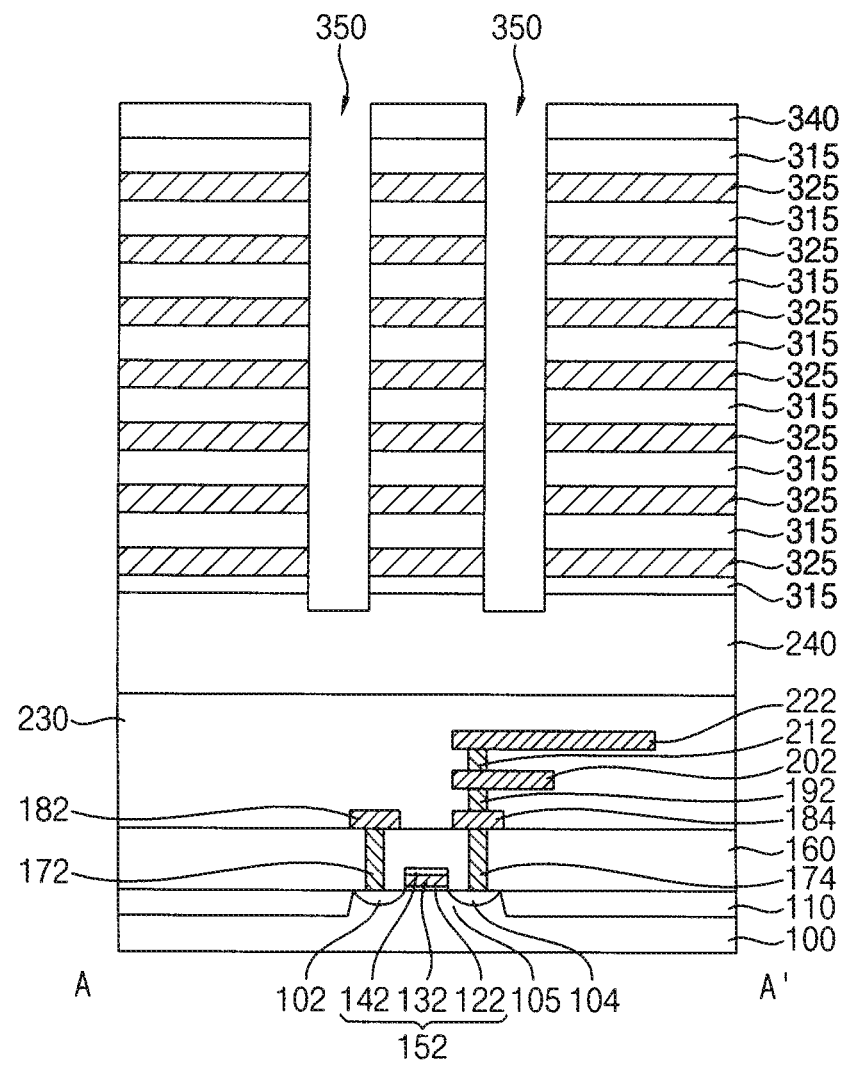
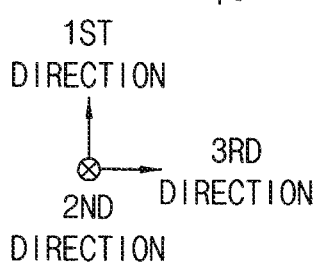

VERTICAL MEMORY DEVICES AND METHODS OF MANUFACTURING THE SAME

CROSS-REFERENCE TO RELATED APPLICATION

This application claims priority under 35 USC § 119 to Korean Patent Application No. 10-2018-0046048, filed on Apr. 20, 2018 in the Korean Intellectual Property Office (KIPO), the contents of which are herein incorporated by reference in their entirety.

BACKGROUND

1. Field

Example embodiments relate to a vertical memory device and/or a method of manufacturing the same. For example, at least some example embodiments relate to a vertical memory device including a contact plug and/or a method of manufacturing the same.

2. Description of the Related Art

In manufacturing a VNAND flash memory device of a cell-over-peri (COP) structure, a common source line (CSL) and a contact plug may be formed by independent processes, and thus the number of process may increase. Additionally, it is difficult to form a plurality of contact plugs to contact corresponding pads only.

SUMMARY

Example embodiments provide a vertical memory device having improved electrical characteristics.

Example embodiments provide a method of manufacturing a vertical memory device having improved electrical characteristics.

At least some example embodiments relate to a vertical memory device. In some example embodiments, the vertical memory device may include gate electrodes on a substrate, the gate electrodes being stacked in a first direction substantially vertical to an upper surface of the substrate, the gate electrodes being stepped in a second direction with an extension length between adjacent ones of the gate electrodes gradually increasing from a lowermost level toward an uppermost level, the second direction being substantially parallel to the upper surface of the substrate, the gate electrodes including a pad at an end portion thereof in the second direction, the pad having a thickness greater than those of other portions of a respective one of the gate electrodes; a channel extending through the gate electrodes in the first direction; and a contact plug extending through the gate electrodes in the first direction, the contact plug contacting the pad of a first gate electrode among the gate electrodes such that the pad is electrically connected thereto and is electrically insulated from second gate electrodes among the gate electrodes.

At least some example embodiments relate to a vertical memory device. In some example embodiments the vertical memory device includes a circuit pattern on a substrate, the substrate including a cell array region and a pad region; an insulating interlayer covering the circuit pattern; a base pattern on the insulating interlayer on the cell array region of the substrate; gate electrodes spaced apart from each other on the base pattern and the insulating interlayer in a first direction, the first direction being substantially vertical to an upper surface of the substrate; a channel extending through the gate electrodes on the cell array region of the substrate; and a contact plug extending through the gate electrodes and the insulating interlayer on the pad region of the substrate such that the contact plug is electrically connected to one of the gate electrodes and the circuit pattern.

At least some example embodiments relate to a vertical memory device. In some example embodiments, the vertical memory device includes gate electrodes on a substrate, the gate electrodes being stacked in a first direction substantially perpendicular to an upper surface of the substrate, and a first portion of each of the gate electrodes having a thickness greater than a thickness of other portions thereof; a channel extending through the gate electrodes in the first direction; and contact plugs each extending through the first portion of corresponding one of the gate electrodes such that the contact plugs are electrically connected thereto and electrically insulated from other ones of the gate electrodes.

At least some example embodiments relate to a method of manufacturing a vertical memory device. In some example embodiments, the method includes alternately and repeatedly stacking a first insulation layer and a sacrificial layer on a substrate in a first direction substantially perpendicular to an upper surface of the substrate, the substrate including a cell array region and a pad region; forming a channel through the first insulation layers and the sacrificial layers in the first direction; forming a first opening through portions of the first insulation layers and the sacrificial layers on the cell array region and the pad region of the substrate; forming a second opening through portions of the first insulation layers and the sacrificial layers on the pad region of the substrate; removing the sacrificial layers via the first opening and the second opening to form gaps between the first insulation layers; forming gate electrodes in each of the gaps; and simultaneously forming a Common Source Line (CSL) and a contact plug in the first opening and the second opening, respectively.

At least some example embodiments relate to a method of manufacturing a vertical memory device. In some example embodiments, the method includes forming a mold including sacrificial patterns on a substrate, the sacrificial patterns being spaced apart from each other by first insulation patterns in a first direction substantially perpendicular to an upper surface of the substrate, the sacrificial patterns being stepped in a second direction with an extension length between adjacent ones of the sacrificial patterns in the second direction gradually decreasing from a lowermost one of the sacrificial patterns toward an uppermost one of the sacrificial patterns, the second direction being substantially parallel to the upper surface of the substrate, and an end portion in the second direction of at least one of the sacrificial patterns having a thickness greater than other portions thereof; forming a channel through the mold in the first direction; removing the sacrificial patterns of the mold to form gaps spaced apart from each other in the first direction; forming gate electrodes in each of the gaps, the gate electrodes including a pad corresponding to the end portion of each of the sacrificial patterns; and forming a contact plug to extend through ones of the gate electrodes in the first direction, the contact plug contacting and being electrically connected to the pad of a first gate electrode among the ones of the gate electrodes and being electrically insulated from second gate electrodes among the ones of the gate electrodes, the first gate electrode being an uppermost one of the ones of the gate electrodes.

In a method of manufacturing a vertical memory device in accordance with example embodiments, the CSL and the contact plugs may be simultaneously formed, and thus the number of process may be reduced. The contact plugs need not contact only one gate electrode, and thus exact process control is not needed.

The second openings for the contact plugs may be formed between the first openings for the gate electrodes, and thus no dummy openings are needed, and the freedom degree of layout design of structures may be increased.

BRIEF DESCRIPTION OF THE DRAWINGS

FIGS. 4 to 33 are plan views and cross-sectional views illustrating a method of manufacturing a vertical memory device in accordance with example embodiments.

DESCRIPTION OF EMBODIMENTS

Vertical memory devices in accordance with example embodiments will be described more fully hereinafter with reference to the accompanying drawings.

Figure 1:
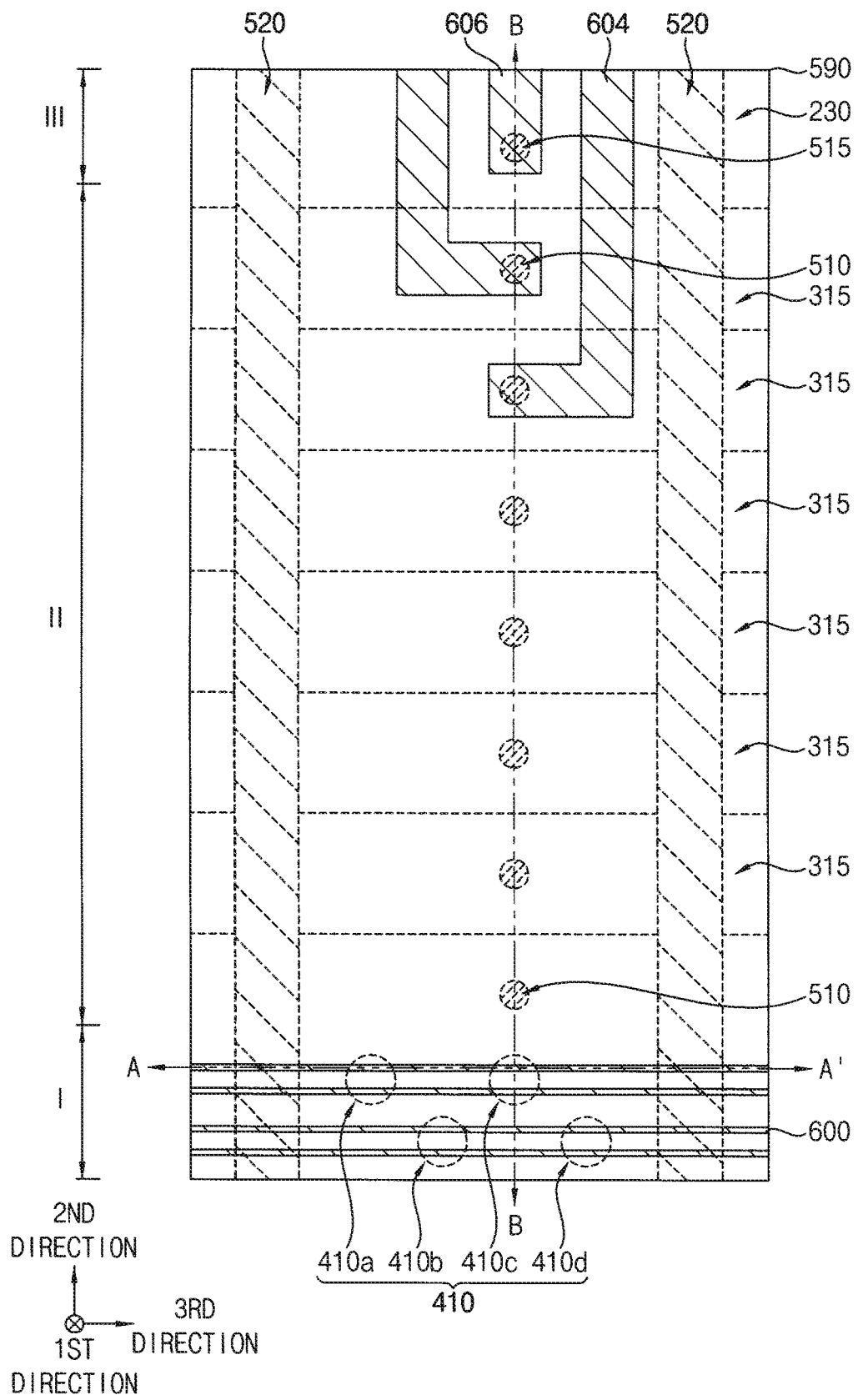
FIGS. 1 to 3 are a plan view and cross-sectional s illustrating a vertical memory device in accordance with example embodiments.

FIGS. 1 to 3 are a plan view and cross-sectional views illustrating a vertical memory device in accordance with example embodiments. Particularly, FIG. 1 is a plan view, and FIGS. 2 and 3 are cross-sectional views.

Figure 2A:
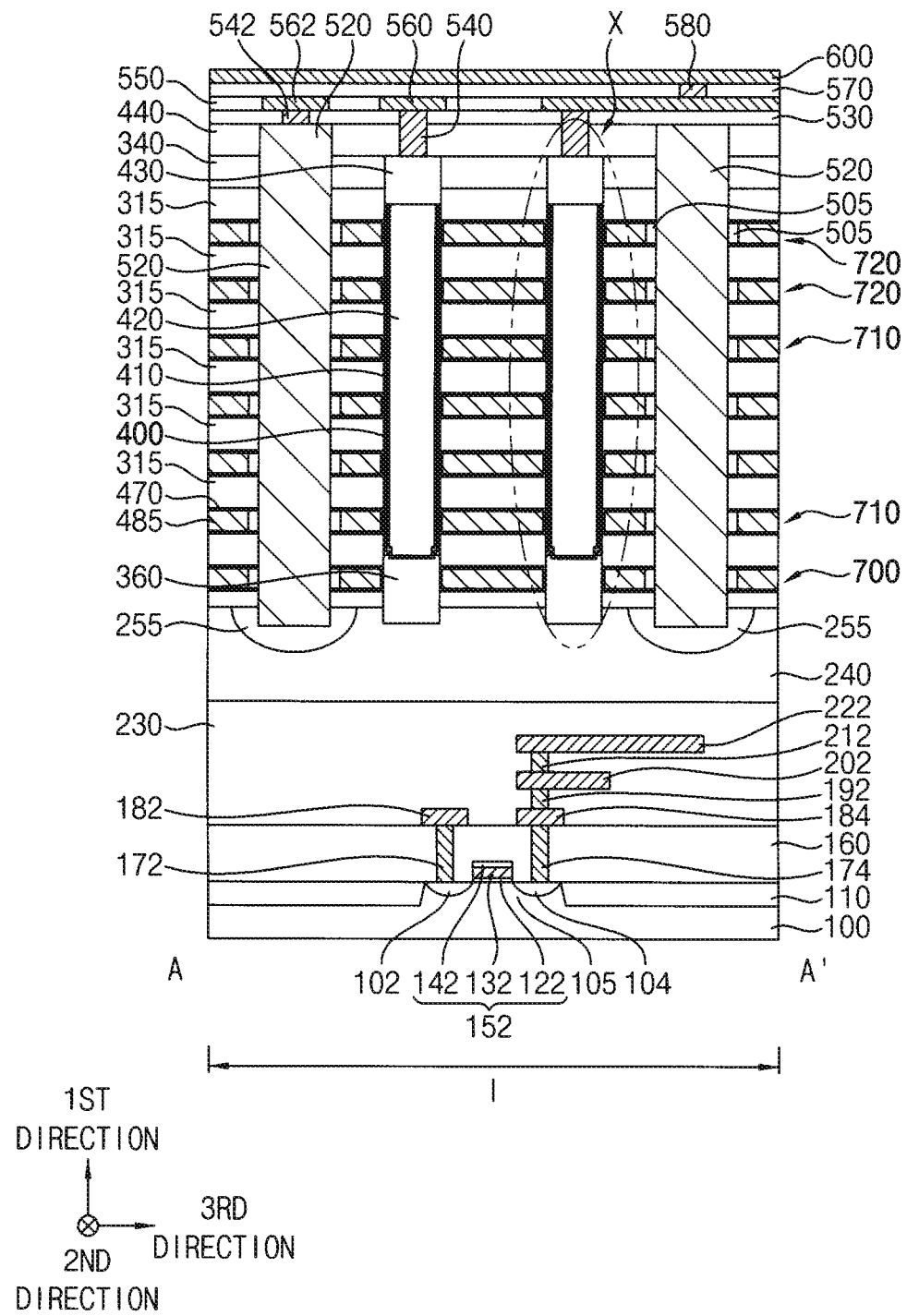
Figure 2B:
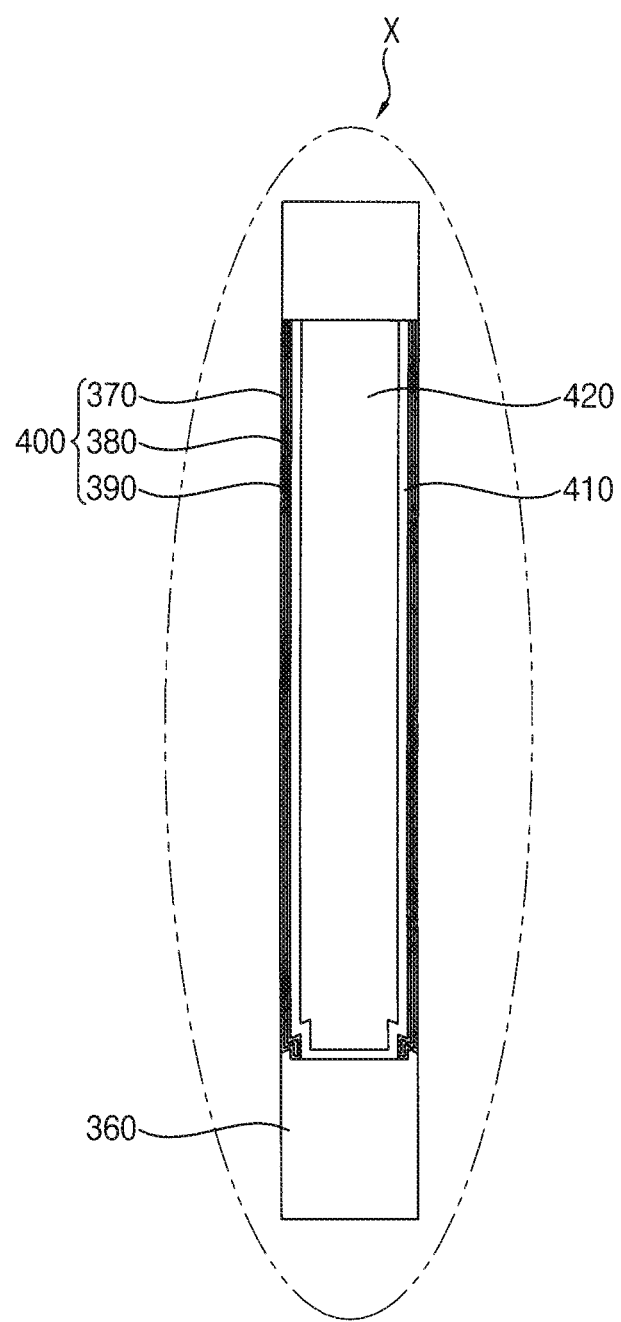
Figure 3A:
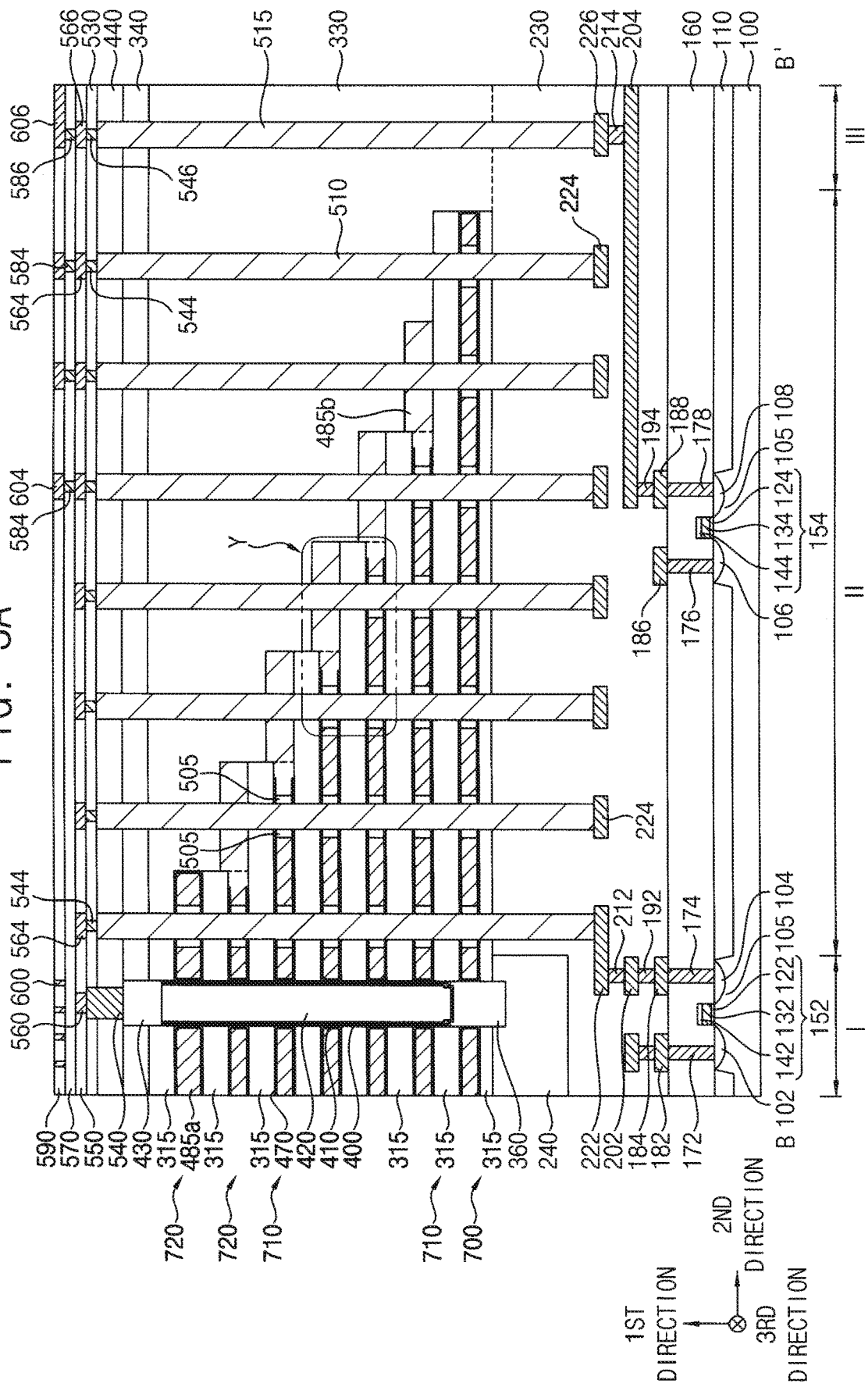
Figure 3B:
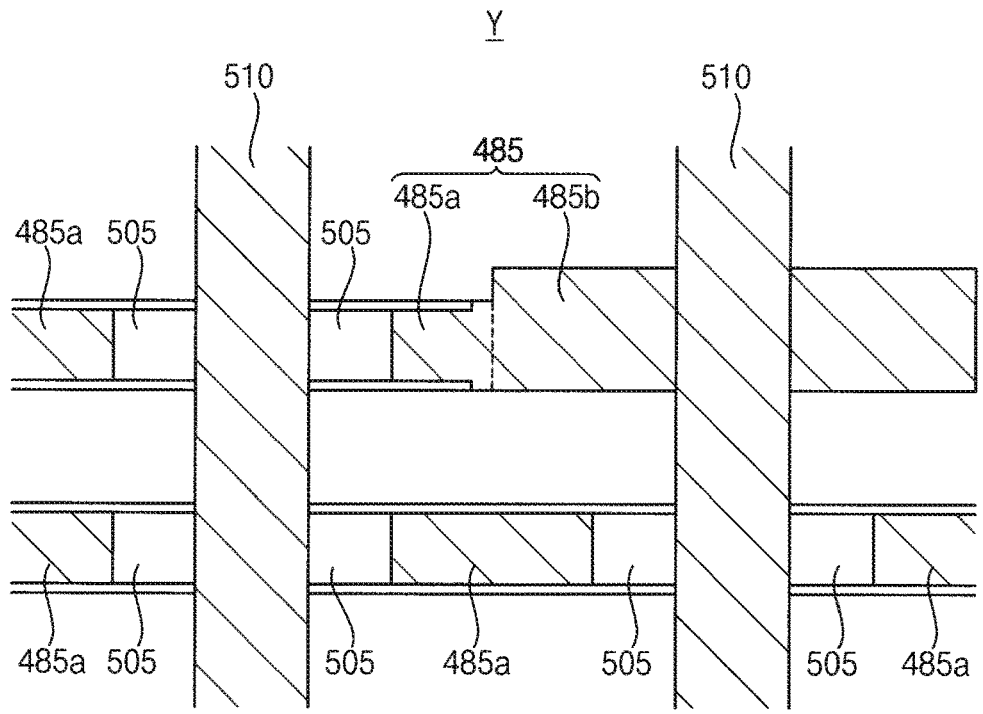
Figure 3C:
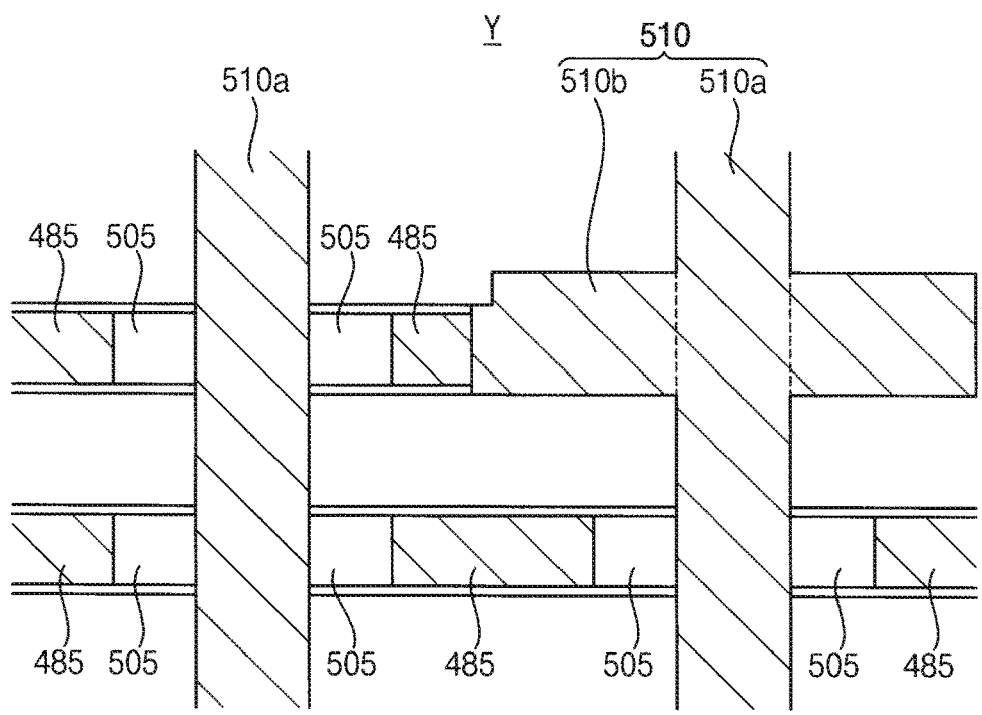

FIG. 1 is a plan view of an edge portion of a first region and second and third regions of a substrate, FIG. 2 is a cross-sectional view taken along a line A-A' of FIG. 1, and FIG. 3 is a cross-sectional view taken along a line B-B' of FIG. 1. FIG. 2B is an enlarged cross-sectional view of a region X of FIG. 2A, and FIGS. 3B and 3C are cross-sectional views of a region Y of FIG. 3A.

Hereinafter, a vertical direction substantially perpendicular to an upper surface of a substrate is defined as a first direction, and two directions intersecting with each other among horizontal directions substantially parallel to the upper surface of the substrate are defined as second and third directions, respectively. In example embodiments, the second and third directions may be orthogonal to each other.

Referring to FIGS. 1, 2A, 2B, 3A and 3B, the vertical memory device may include a circuit pattern on a substrate 100, memory cells over the circuit pattern, and a first upper contact plug 510 electrically connecting the circuit pattern and the memory cells to each other. The vertical memory device may further include a base pattern 240, a common source line (CSL) 520, second to sixth upper contact plugs 515, 540, 542, 544 and 546, first, third and fourth upper vias 580, 584 and 586, a second upper via (not shown), first to fifth upper wirings 560, 562, 564, 566 and 600, a sixth upper wiring (not shown), and seventh and eighth upper wirings 604 and 606.

The substrate 100 may include semiconductor materials e.g., silicon, germanium, silicon-germanium, etc., or III-V compounds e.g., GaP, GaAs, GaSb, etc. In example embodiments, the substrate 100 may be a silicon-on-insulator (SOI) substrate or a germanium-on-insulator (GOI) substrate.

In example embodiments, the substrate 100 may include first to third regions I, II and III. The first region I may be a cell array region in which a memory cell array may be formed, and the second region II may be a pad region in which gate electrode pads may be formed. The cell array region and the pad region may be referred to as a memory cell region, and the third region III may be a peripheral region surrounding the memory cell array region. In some embodiments, the substrate 100 may not include the third region III, but may include the first and second regions I and II only.

The substrate 100 may include a field region on which 110 is formed, and an active region 105 on which no isolation pattern is formed.

In example embodiments, the vertical memory device may have a cell-over-peri (COP) structure. That is, the circuit pattern for driving memory cells may not be to a peripheral area of the memory cells, but formed under the memory cells. Thus, a circuit pattern region in which the circuit pattern is formed and the memory cell region may be vertically stacked, and the circuit pattern may be also referred to as a lower circuit pattern.

The circuit pattern may include transistors, lower contact plugs, lower wirings, lower vias, etc. FIGS. 2 and 3 show first and second transistors, first to fourth lower contact plugs 172, 174, 176 and 178, first to ninth lower wirings 182, 184, 186, 188, 202, 204, 222, 224 and 226, and first to fourth lower s 192, 194, 212 and 214, however, the inventive concepts may not be limited thereto.

The first transistor may include a first lower gate structure 152 on the first region I of the substrate 100 and first and second impurity regions 102 and 104 at upper portions of the active region 105 adjacent the first lower gate structure 152, and the second transistor may include a second lower gate structure 154 on the second region II of the substrate 100 and third and fourth impurity regions 106 and 108 at upper portions of the active region 105 adjacent the second lower gate structure 154.

The first lower gate structure 152 may include a first lower gate insulation pattern 122, a first lower gate electrode 132 and a first lower gate mask 142 sequentially stacked on the substrate 100, and the second lower gate structure 154 may include a second lower gate insulation patter l 124, a second lower gate electrode 134 and a second lower gate mask 144 sequentially stacked on the substrate 100.

The first and second gate insulation patterns 122 and 124 may include an oxide, e.g., silicon oxide, the first and second lower gate electrodes 132 and 134 may include, e.g., a metal, a metal nitride, a metal silicide, doped polysilicon, etc., and the first and second lower gate masks 142 and 144 may include a nitride, e.g., silicon nitride. The first to fourth impurity regions 102, 104, 106, 108 may include n-type impurities or p-type impurities.

The first and second transistors may be covered by a first insulating interlayer 160 on the substrate 100, and the first to fourth lower contact plugs 172, 174, 176 and 178 may extend through the first insulating interlayer 160 to contact upper surfaces of the first to fourth impurity regions 102, 104, 106 and 108, respectively.

The first to fourth lower wirings 182, 184, 186 and 188 may be formed on the first insulating interlayer 160 to contact upper surfaces of the first to fourth lower contact plugs 172, 174, 176 and 178, respectively. The first lower via 192, the fifth lower wiring 202, the third lower via 212 and the seventh lower wiring 222 may be sequentially stacked on the second lower wiring 184, and the second lower via 194, the sixth lower wiring 204, the fourth lower via 214 and the ninth lower wiring 226 may be sequentially stacked on the fourth lower wiring 188. The eighth lower wiring 224 may be formed on the second region II of the substrate 100, and a plurality of eighth lower wirings 224 may be formed at substantially the same level at which the seventh and ninth lower wirings 222 and 226 are formed to be electrically connected to other transistors (not shown) of the circuit pattern.

The first to fourth lower contact plugs 172, 174, 176 and 178, the first to ninth lower wirings 182, 184, 186, 188, 202, 204, 222, 224 and 226, and the first to fourth lower vias 192, 194, 212 and 214 may include a metal, a metal nitride or doped polysilicon.

FIGS. 2 and 3 show that the lower wirings 182, 184, 186, 188, 202, 204, 222, 224, 226 are formed at three levels on the first insulating interlayer 160, however, the inventive concepts may not be limited thereto.

A second insulating interlayer 230 may be formed on the first insulating interlayer 160 to cover the first to ninth lower wirings 182, 184, 186, 188, 202, 204, 222, 224 and 226 and the first to fourth lower vias 192, 194, 212 and 214.

The base pattern 240 may be formed on the second insulating interlayer 230. In example embodiments, the base pattern 240 may be formed on the first region I of the substrate 100, and a sidewall of the base pattern 240 may be covered by the second insulating interlayer 230. An upper surface of the base pattern 240 may be substantially coplanar with an upper surface of the second insulating interlayer 230. The base pattern 240 may include, e.g., polysilicon.

The memory cells may be formed on the base pattern 240 and the second insulating interlayer 230 on the first and second regions I and II of the substrate 100.

The memory cells may be arranged in each of the second and third directions to form a memory cell array. The memory cell array may include a plurality of memory cell blocks spaced apart from each other in the third direction, which may be divided by the CSL 520 extending in the second direction.

Each memory cell block may include a channel block therein. Each channel block may include a plurality of channel columns containing a plurality of channels 410 arranged in the second direction. In an example embodiment, each channel block may include first, second, third and fourth channel columns 410a, 410b, 410c and 410d arranged in the third direction in this order, however, the inventive concepts may not be limited thereto.

Each memory cell block may include a plurality of gate electrodes 485 spaced apart from each other in the first direction, first insulation patterns 315 between neighboring ones of the gate electrodes 485, and a second structure extending through the gate electrodes 485 and the first insulation patterns 315.

The gate electrode 485 may be formed on the first and second regions I and II of the substrate 100, and a plurality of gate electrodes 485 may be formed at a plurality of levels, respectively, to be spaced apart from each other. Each of the gate electrodes 485 may extend in the second direction on the first and second regions I and II of the substrate 100. Extension lengths of the gate electrodes 485 in the second direction may gradually decrease from a lowermost level toward an uppermost level, and thus the gate electrodes 485 may have a staircase shape as a whole.

The gate electrode 485 may include a first conductive pattern 485a and a pad 485b. The first conductive pattern 485a may extend in the second direction on the first and second regions I and II of the substrate 100, and the pad 485b may be formed at each of opposite ends of the first conductive pattern 485a on the second region II of the substrate 100. That is, the pad 485 may be formed at each of opposite ends of the gate electrode 485.

In example embodiments, the pad 485b of at least one of the gate electrodes 485 at the respective levels may have an upper surface higher than that of the first conductive pattern 485a of the at least one of the gate electrodes 485, so as to have a thickness greater than that of the first conductive pattern 485a thereof. In the figure, the pad 485b of each of the gate electrodes 485 at all levels except for an uppermost level and a lowermost level has a thickness greater than that of the first conductive pattern 485a thereof, however, the inventive concepts may not be limited thereto. For example, the pad 485b of each of the gate electrodes 485 at all levels may have a thickness greater than that of the first conductive pattern 485a thereof.

Upper and lower surfaces and a sidewall of each of the first conductive pattern 485a and the pad 485b may be covered by a first barrier pattern (not shown) and a second barrier pattern (not shown), respectively. The first conductive pattern 485a and the pad 485b may include a low resistance metal, e.g., tungsten, titanium, tantalum, platinum, etc., and the first and second barrier patterns may include a metal nitride, e.g., titanium nitride, tantalum nitride, etc. In an example embodiment, the first conductive pattern 485a and the pad 485b may include substantially the same material.

The gate electrode 485 may include first, second and third gate electrodes 700, 710 and 720 sequentially stacked in the first direction. The first gate electrode 700 may serve as a ground selection line (GSL), the second gate electrode 710 may serve as a word line, and the third gate electrode 720 may serve as a string selection line (SSL). Each of the first to third gate electrodes 700, 710 and 720 may be formed at one or a plurality of levels.

In example embodiments, the first gate electrode 700 may be formed at the lowermost level, the third gate electrode 720 may be formed at the uppermost level and a level directly below the uppermost level, i.e., a second level from above, and the second gate electrode 710 may be formed between the first and third gate electrodes 700 and 720.

Sidewalls of the gate electrodes 485, which may be stacked in a staircase shape, may be covered by a fourth insulating interlayer pattern 330 on the second insulating interlayer 230, and fifth and sixth insulating interlayers 340 and 440 may be sequentially stacked on the first insulation pattern 315 and the fourth insulating interlayer pattern 330.

An upper surface, a lower surface, and a sidewall adjacent the channel 410 of the gate electrode 485 may be covered by a second blocking layer 470. In an example embodiment, the second blocking layer 470 may not cover upper and lower surfaces or a sidewall of the pad 485b of the gate electrode 485. The second blocking layer 470 may include a metal oxide, e.g., aluminum oxide, hafnium oxide, etc.

The first insulation patterns 315 may include an oxide, e.g., silicon oxide, and may be merged with the fourth insulating interlayer pattern 330 at a sidewall thereof or the fifth insulating interlayer 340 on the uppermost one of the first insulation patterns 315.

The second structure may include a first structure containing a semiconductor pattern 360, a charge storage structure 400, a channel 410 and a filling pattern 420 on the base pattern 240, and a capping pattern 430 on the first structure.

The semiconductor pattern 360 may include single crystalline silicon or single crystalline germanium according to the material of the base pattern 240, and in some embodiments, may be doped with impurities. In example embodiments, the semiconductor pattern 360 may have a pillar shape, and an upper surface of the semiconductor pattern 360 may be located between upper and lower surfaces of one of the first insulation patterns 315 at a second level from below in the first direction. The semiconductor pattern 360 may serve as a channel as the overlying channel 410, and thus may be referred to as a lower channel.

The channel 410 may extend in the first direction on a central upper surface of the semiconductor pattern 360 to have a cup-like shape. The charge storage structure 400 may extend in the first direction on an edge upper surface of the semiconductor pattern 360 to cover an outer sidewall of the channel 410, and may have a cup-like shape of which a central lower surface is opened. The filling pattern 420 may have a pillar shape for filling an inner space defined by the cup-like shape channel 410.

The charge storage structure 400 may include a first blocking pattern 370, a charge storage pattern 380 and a tunnel insulation pattern 390 sequentially stacked.

The channel 410 may include doped or undoped single crystalline silicon. The first blocking pattern 370 may include an oxide, e.g., silicon oxide, and the charge storage pattern 380 may include a nitride, e.g., silicon nitride, and the tunnel insulation pattern 390 may include an oxide, e.g., silicon oxide. The filling pattern 420 may include an oxide, e.g., silicon oxide.

The capping pattern 430 may include doped or undoped single crystalline silicon or polysilicon. The capping pattern 430 may extend through the fifth insulating interlayer 340 and an upper portion of an uppermost one of the first insulation patterns 315.

The CSL 520 may extend in the first direction, and may contact an upper surface of a fifth impurity region 255 at an upper portion of the base pattern 240. The CSL 520 may extend in the second direction to separate the gate electrodes from each other in the third direction. However, both sidewalls of the CSL 520 may contact the first insulation pattern 315 or may be covered by the second insulation pattern 505, so as to be electrically insulated from the gate electrodes.

In example embodiments, the CSL 520 may include substantially the same material as that of the pad 485*b* of the gate electrode.

The first upper contact plug 510 may extend in the first direction on the second region II of the substrate 100 to be connected to the eighth wiring 224, and may extend through the fifth and sixth insulating interlayers 340 and 440, the fourth insulating interlayer pattern 330, one or ones of the gate electrodes 485 and the second insulating interlayer 230.

The first upper contact plug 510 may extend through and contact the pad 485*b* of one of the gate electrodes 485 at one level, and may extend through the first conductive patterns 485*a* of ones of the gate electrodes 485 at other levels, that is, at lower levels, however, may be electrically insulated therefrom by the second insulation pattern 505 surrounding a sidewall of the first upper contact plug 510.

In example embodiments, the first upper contact plug 510 may include substantially the same material as that of the pad 485*b* of the gate electrode 485.

Referring to FIG. 3C, the first upper contact plug 510 may include a first extension portion 510*a*, which may extend in the first direction to contact an upper surface of the eighth lower wiring 224, and a second extension portion 510*b*, which may be formed at each of opposite sides of the first extension portion 510*a* in the second direction to contact the first extension portion 510*a* and extend in the third direction between neighboring ones of the CSLs 520.

In a method of manufacturing the vertical memory device subsequently illustrated, the first and second extension portions 510*a* and 510*b* may be formed to include substantially the same material by the same process, and thus may form the first upper contact plug 510. In this case, the gate electrode 485 may include the first conductive pattern 485*a* only.

An upper surface of a portion of the second extension portion 510*b* adjacent the first extension portion 510*a* may be higher than an upper surface of a portion of the second extension portion 510*b* adjacent the first conductive pattern 485*a*, that is, the gate electrode 485, and thus the portion of the second extension portion 510*b* adjacent the first extension portion 510*a* may have a thickness greater than that of the gate electrode 485. In example embodiments, the second extension portion 510*b* of the first upper contact plug 510 may have a staircase shape.

The second upper contact plug 515 may extend through the second, fifth and sixth insulating interlayers 230, 340 and 440 and the fourth insulating interlayer pattern 330 on the third region III of the substrate 100 to be connected to an upper surface of the ninth lower wiring 226. In an example embodiment, the second upper contact plug 515 may include substantially the same material as that of the first upper contact plug 510.

Seventh to tenth insulating interlayers 530, 550, 570 and 590 may be sequentially stacked on the sixth insulating interlayer 440, the CSL 520 and the first and second upper contact plugs 510 and 515, and an upper circuit pattern may be formed therein. In the figure, an illustrative layout of the upper circuit pattern is shown, however, the inventive concepts may not be limited thereto, and the upper circuit pattern may have various layouts.

In example embodiments, the first, second, fifth to tenth insulating interlayers 160, 230, 340, 440, 530, 550, 570 and 590 and the fourth insulating interlayer pattern 330 may include an oxide, e.g., silicon oxide, and some or all of them may be merged with each other.

The third upper contact plug 540 may extend through the sixth and seventh insulating interlayers 440 and 530 to contact an upper surface of the capping pattern 430, the fourth upper contact plug 542 may extend through the seventh insulating interlayer 530 to contact an upper surface of the CSL 520, and the fifth and sixth upper contact plugs 544 and 546 may extend through the seventh insulating interlayer 530 to contact upper surfaces of the first and second upper contact plugs 510 and 515, respectively.

The first to fourth upper wirings 560, 562, 564 and 566 may extend through the eighth insulating interlayer 550 to contact upper surfaces of the third to sixth upper contact plugs 540, 542, 544 and 546, respectively. The first upper via 580, the second upper via (not shown), the third upper via 584 and the fourth upper via 586 may extend through the ninth insulating interlayer 570 to contact upper surfaces of the first to fourth upper wirings 560, 562, 564 and 566, respectively.

The fifth upper wiring 600, the sixth upper wiring (not shown), the seventh upper wiring 604 and the eighth upper wiring 606 may extend through the tenth insulating interlayer 590 to contact upper surfaces of the first upper via 580, the second upper via, the third upper via 584 and the fourth upper via 586, respectively. In example embodiments, the fifth upper wiring 600 may extend in the third direction, and a plurality of fifth upper wirings 600 may be formed in the second direction. The fifth upper wiring 600 may serve as a bit line 600 of the vertical memory device.

The vertical memory device may further include upper wirings.

In the vertical memory device, the memory cell and the lower circuit pattern may be electrically connected to each other by the first upper contact plug 510, which may extend through ones of the gate electrodes 485 at a plurality of levels, respectively, however, may be electrically connected to only an uppermost one of the ones of the gate electrodes 485 through which the first upper contact plug 510 may extend. That is, the first upper contact plug 510 may extend through and contact the pad 485b of one of the gate electrodes 485 at a level so as to be electrically connected thereto, while the first upper contact plug 510 may extend through ones of the gate electrodes 485 at lower levels but may be electrically insulated therefrom by the second insulation pattern 505.

FIGS. 4 to 33 are plan views and cross-sectional views illustrating a method of manufacturing a vertical memory device in accordance with example embodiments. Specifically, FIGS. 4, 10, 14, 20 and 29 are plan views, and FIGS. 5-9, 11-13, 15-19, 21-28 and 30-33 are cross-sectional views.

Figure 16:
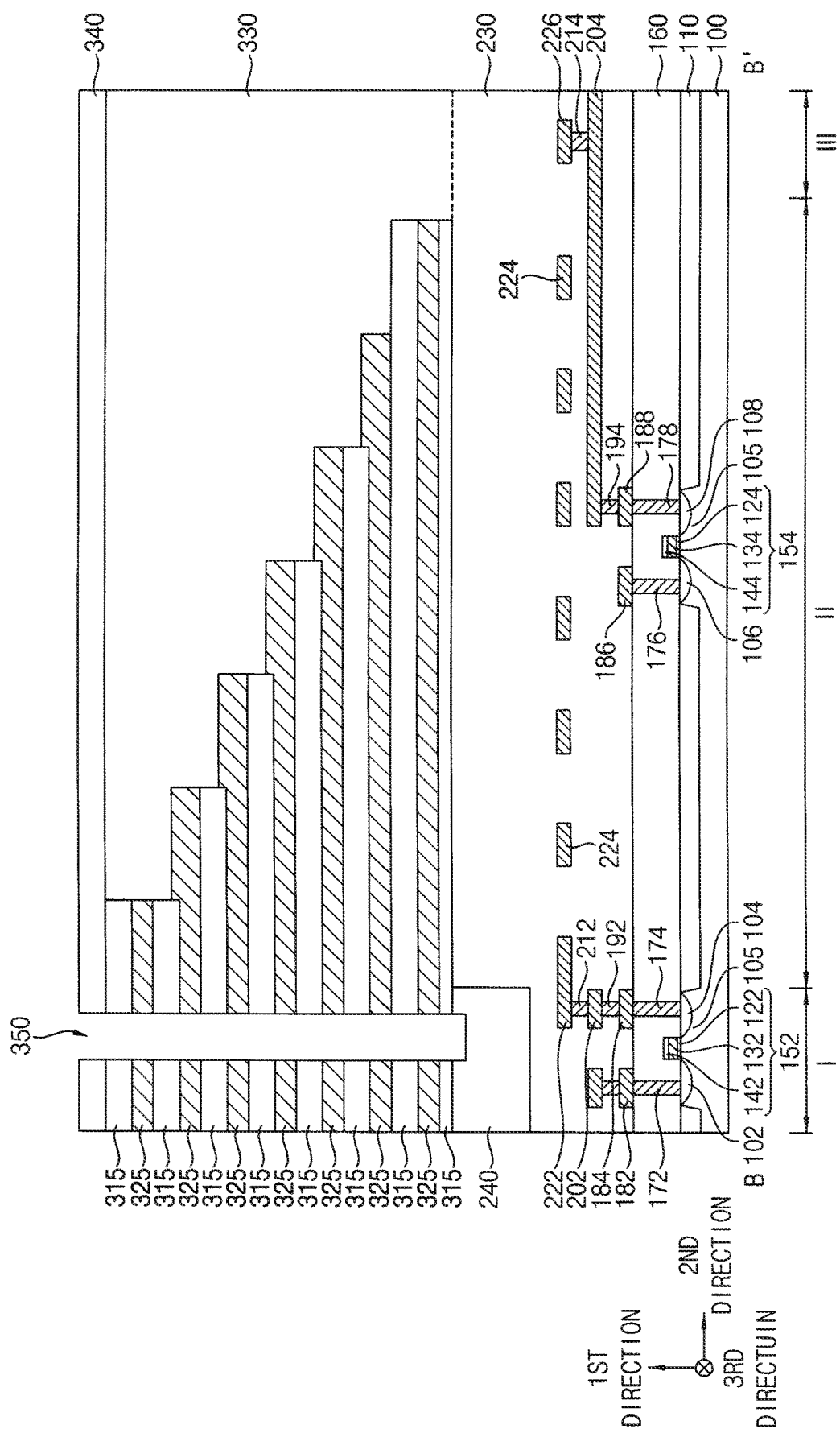
Figure 17:
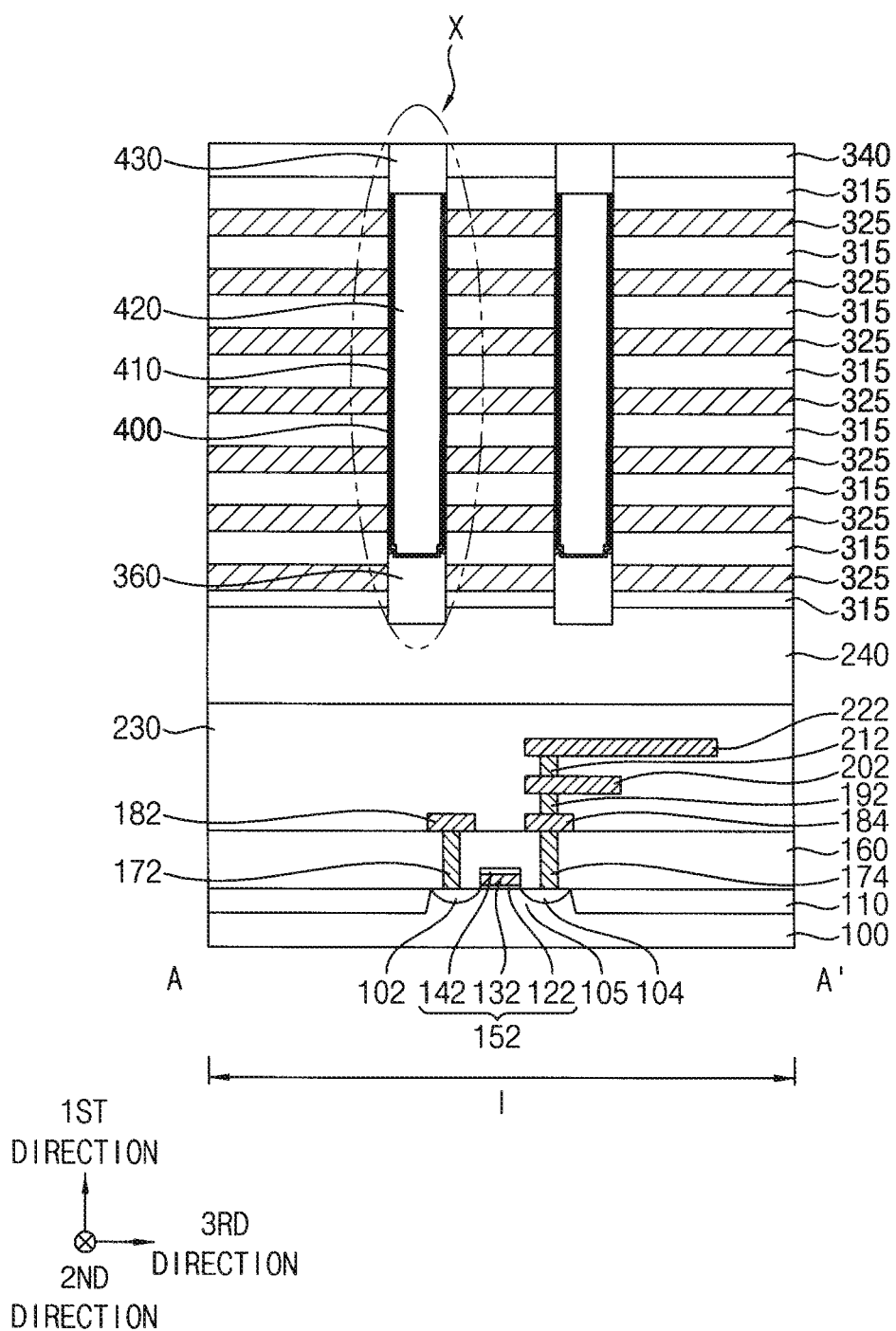
Figure 18:
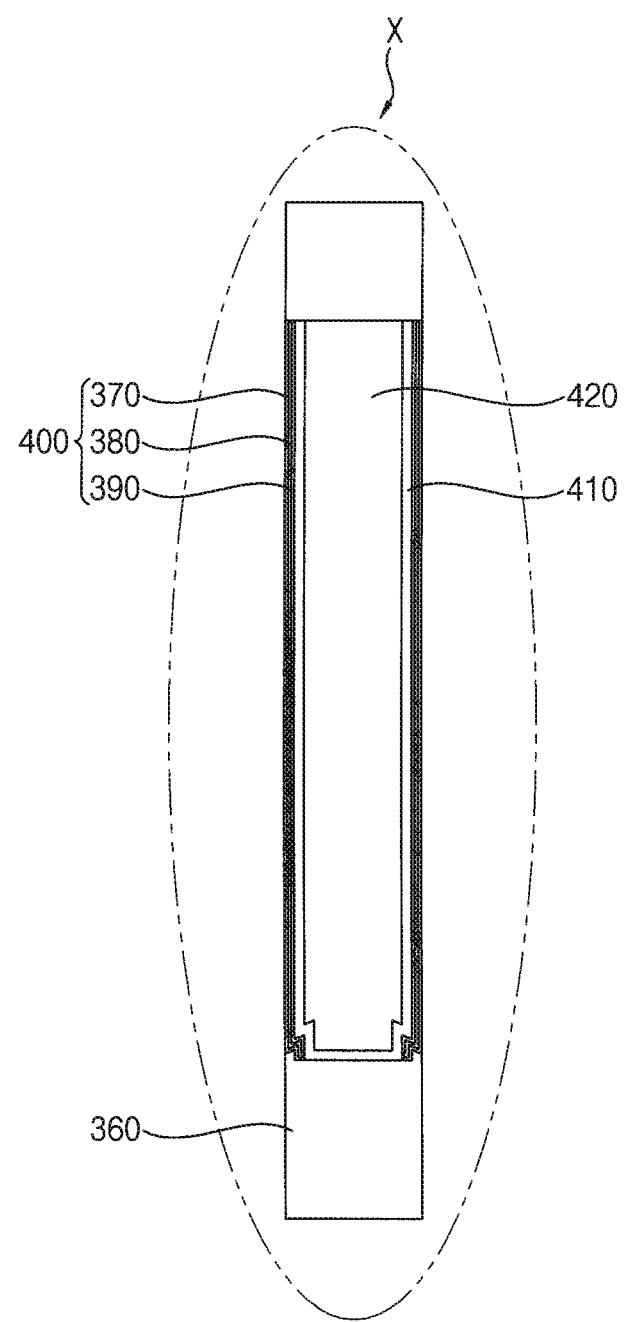
Figure 32:
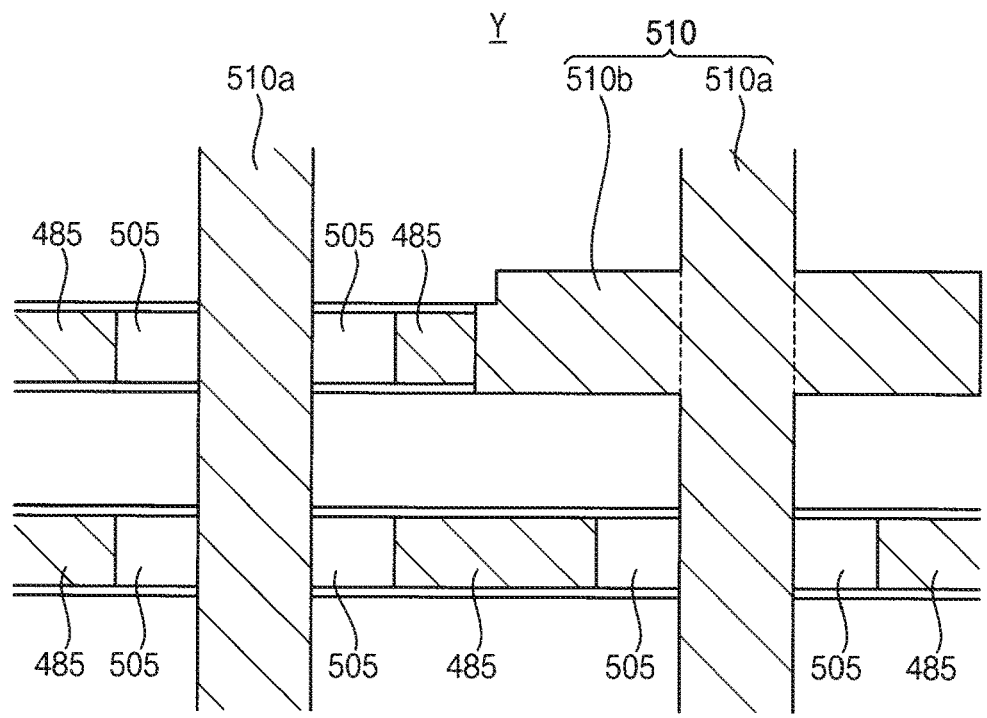
Figure 33:
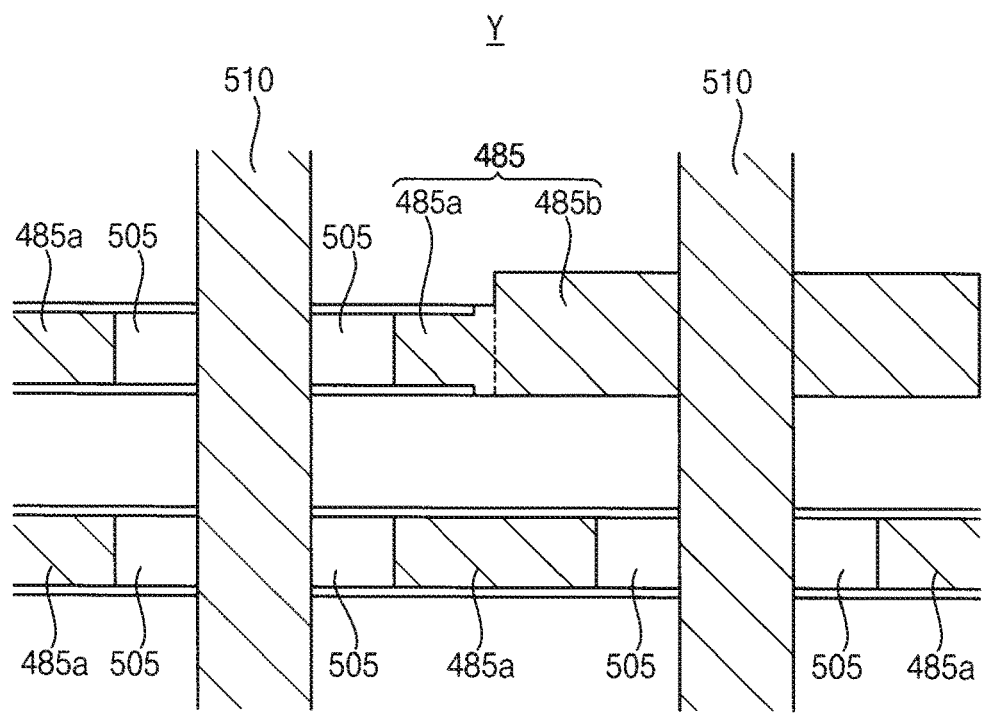

FIGS. 5, 7, 15, 17-18, 21, 23 and 30 are cross-sectional views taken along lines A-A' of corresponding plan views, respectively, and FIGS. 6, 8-9, 11-13, 16, 19, 22, 24-29 and 31 are cross-sectional views taken along lines B-B' of corresponding plan views, respectively. FIG. 18 is an enlarged cross-sectional view of a region X in FIG. 17, FIGS. 25-28 are enlarged cross-sectional views of a region Y in FIG. 24, and FIGS. 32 and 33 are enlarged cross-sectional views of a region Y in FIG. 29.

Figure 4:
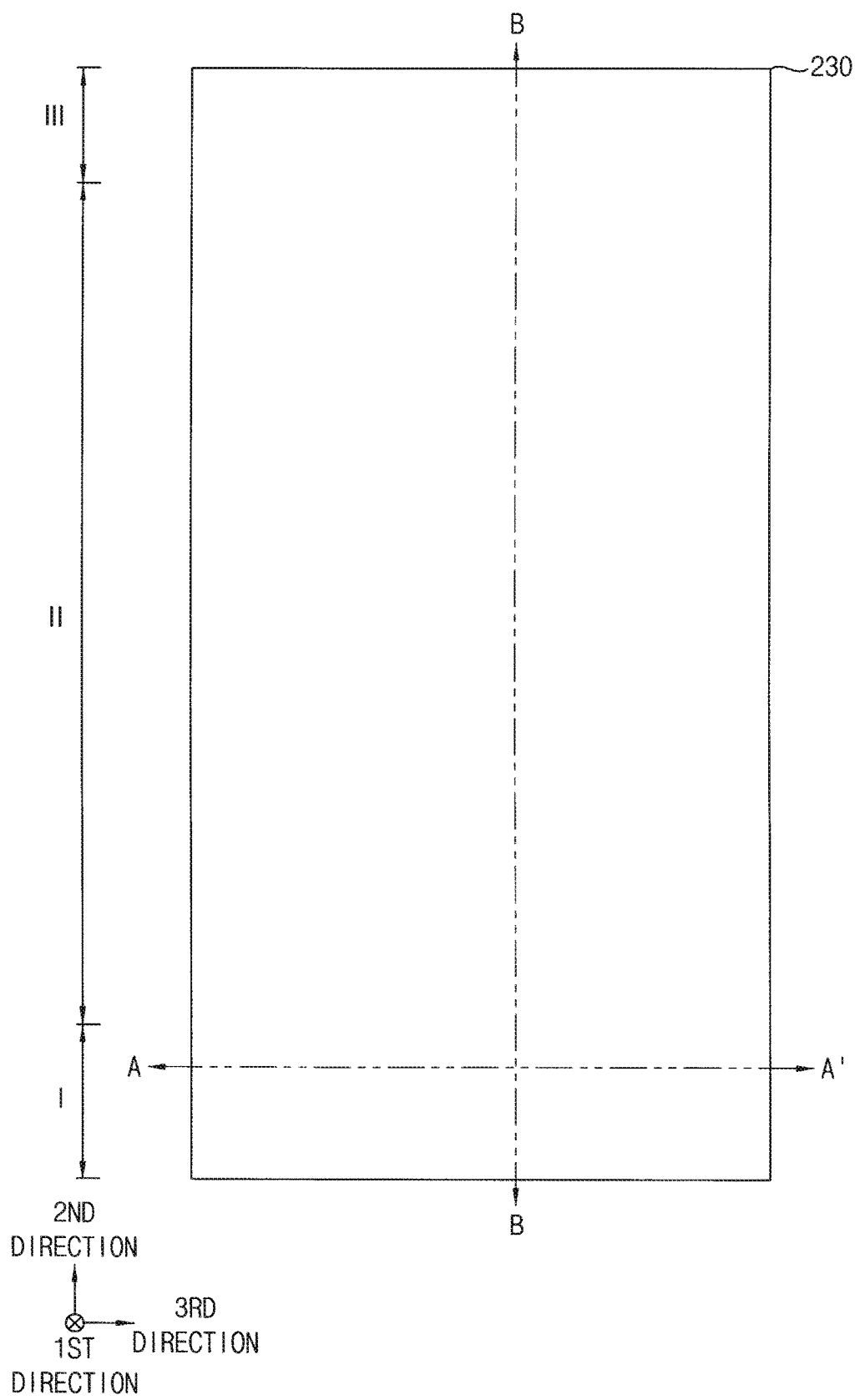
Figure 5:
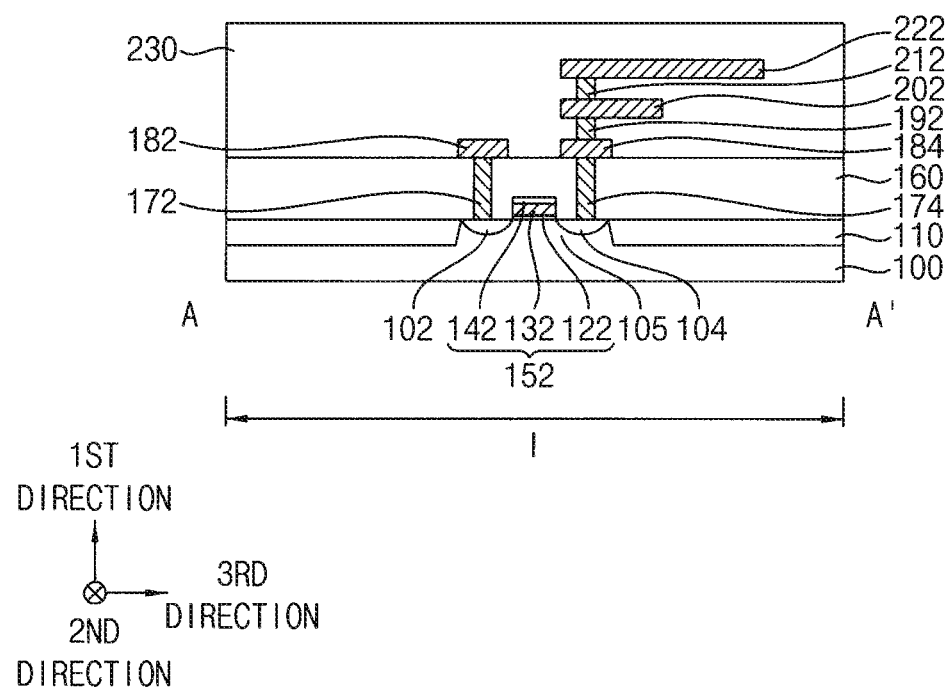
Figure 6:
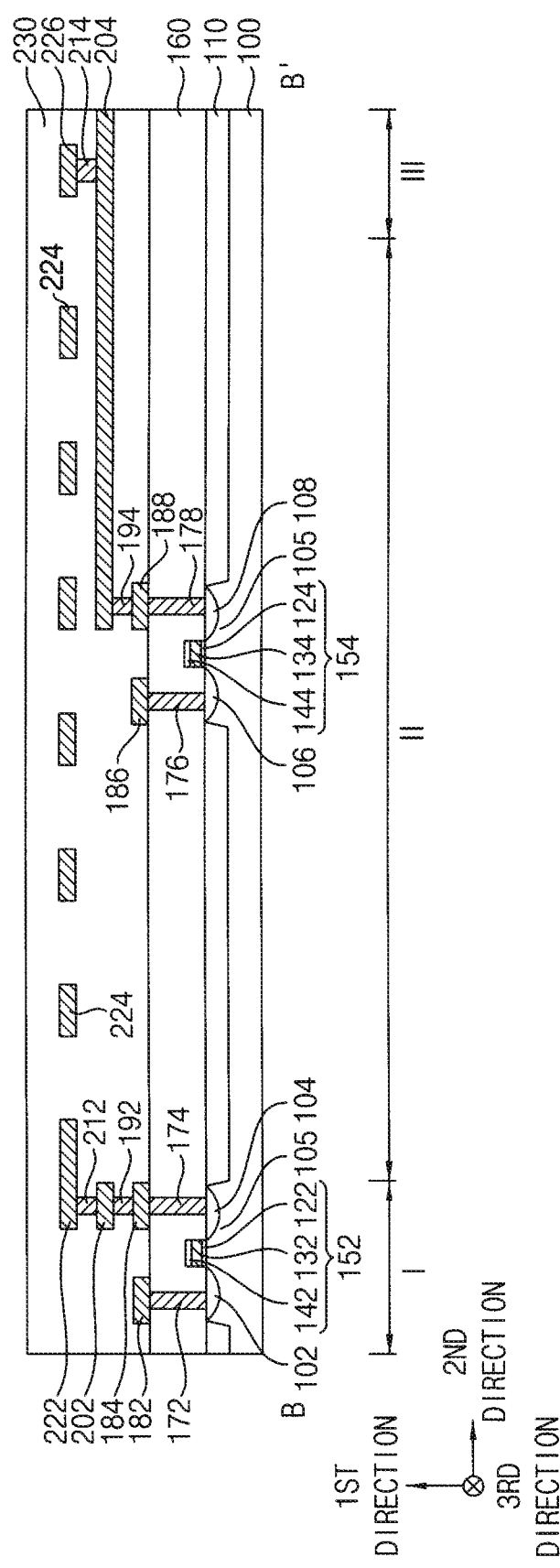

Referring to FIGS. 4 to 6, a circuit pattern may be formed on a substrate 100, and first and second insulating interlayers 160 and 230 may be sequentially formed on the substrate 100 to cover the circuit pattern.

The substrate 100 may include a field region on which an isolation pattern 110 is formed and an active region 105 on which no isolation pattern is formed. The isolation pattern 110 may be formed by, e.g., a shallow trench isolation (STI) process.

In example embodiments, the vertical memory device may have a cell-over-peri (COP) process. That is, a circuit pattern region in which the circuit pattern may be formed and a memory cell region in which memory cells may be formed may be vertically stacked on the substrate 100.

The circuit pattern may include, e.g., transistors, lower contact plugs, lower wirings, lower vias, etc. In an example embodiment, a first transistor including a first lower gate structure 152 on a first region I of the substrate 100 and first and second impurity regions 102 and 104 at upper portions of the active region 105 adjacent the first lower gate structure 152, and a second transistor including a second lower gate structure 154 on a second region II of the substrate 100 and third and fourth impurity regions 106 and 108 at upper portions of the active region 105 adjacent the second lower gate structure 154 may be formed.

The first lower gate structure 152 may include a first lower gate 122, a first lower gate electrode 132 and a first lower gate mask 142 sequentially stacked on the substrate 100, and the second lower gate structure 154 may include a second lower gate insulation pattern 124, a second lower gate electrode 134 and a second lower gate mask 144 sequentially stacked on e substrate 100.

The first insulating interlayer 160 may be formed on the substrate 100 to cover the first and second transistors, and first to fourth lower contact plugs 172, 174, 176 and 178 may extend through the first insulating interlayer 160 to contact upper surfaces of the first to fourth impurity regions 102, 104, 106 and 108, respectively.

First to fourth lower wirings 182, 184, 186 and 188 may be formed on the first insulating interlayer 160 to contact upper surfaces of the first to fourth lower contact plugs 172, 174, 176 and 178, respectively. A first lower via 192, a fifth lower wiring 202, a third lower via 212 and a seventh lower wiring 222 may be sequentially stacked on the second lower wiring 184. A second lower via 194, a sixth lower wiring 204, a fourth lower via 214 and a ninth lower wiring 226 may be sequentially stacked on the fourth lower wiring 188. A plurality of eighth lower wirings 224 may be formed at substantially the same level at which the seventh and ninth lower wirings 222 and 226 are formed to be electrically connected to other transistors (not shown) of the circuit pattern.

In example embodiments, the first to ninth lower wirings 182, 184, 186, 188, 202, 204, 222, 224 and 226 and the first to fourth lower vias 192, 194, 212 and 214 may be formed by a damascene process, however, may be also formed by a patterning process.

The second insulating interlayer 230 may be formed on the first insulating interlayer 160 to cover the first to ninth lower wirings 182, 184, 186, 188, 202, 204, 222, 224 and 226 and the first to fourth lower vias 192, 194, 212 and 214. In some embodiments, the second insulating interlayer 230 may be merged with the first insulating interlayer 160.

Figure 7:
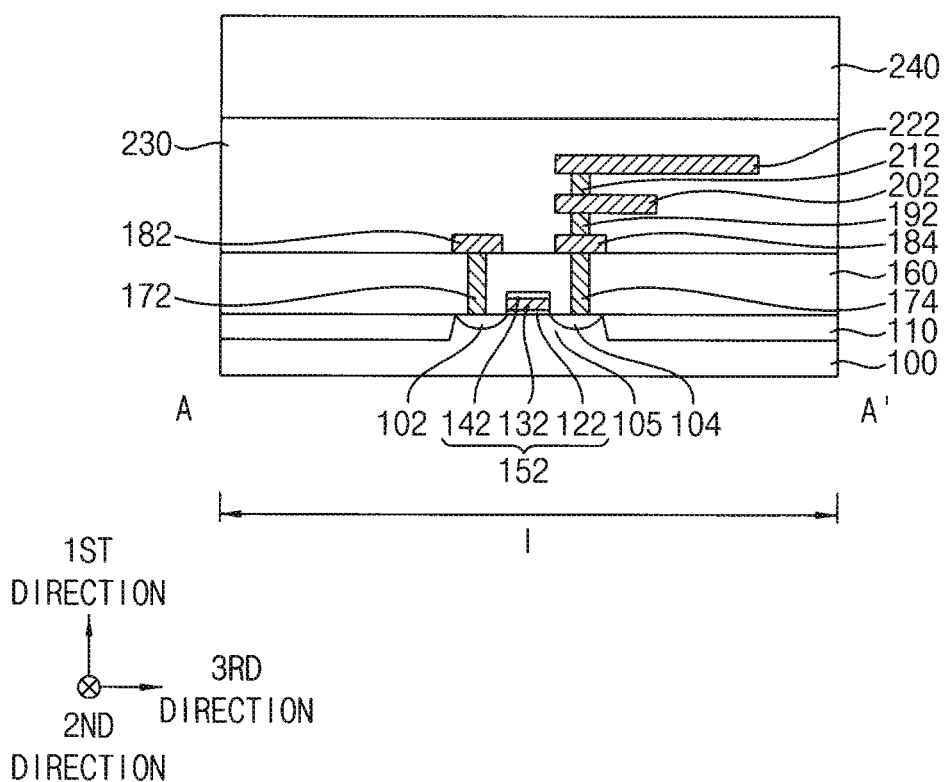
Figure 8:
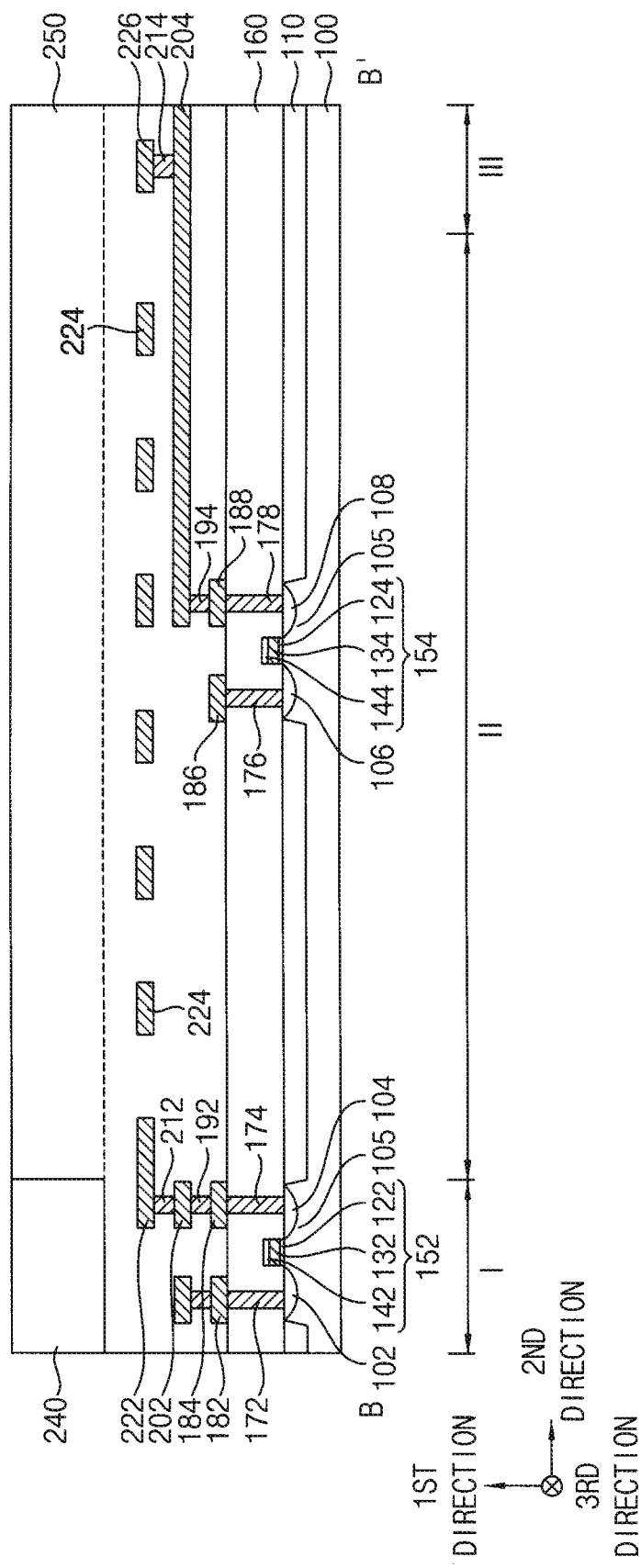

Referring to FIGS. 7 and 8, a base pattern 240 may be formed on the second insulating interlayer 230, and a third insulating interlayer pattern 250 may be formed on the second insulating interlayer 230 to cover a sidewall of the base pattern 240.

The base pattern 240 may be formed by forming a base layer on the second insulating interlayer 230 using, e.g., a chemical vapor deposition (CVD) process, an atomic layer deposition (ALD) process, etc., and patterning the base layer so as to remain only on the first region I of the substrate 100.

The third insulating interlayer pattern 250 may be formed by forming a third insulating interlayer on the second insulating interlayer 230 to cover the base pattern 240, and planarizing the third insulating interlayer until an upper surface of the base pattern 240 may be exposed.

The third insulating interlayer pattern 250 may be merged with the underlying second insulating interlayer 230, and hereinafter, the merged third insulating interlayer pattern 250 and the second insulating interlayer 230 may be referred to as the second insulating interlayer 230. In example embodiments, the planarization process may be performed by a chemical mechanical polishing (CMP) process and/or an etch back process.

Figure 9:
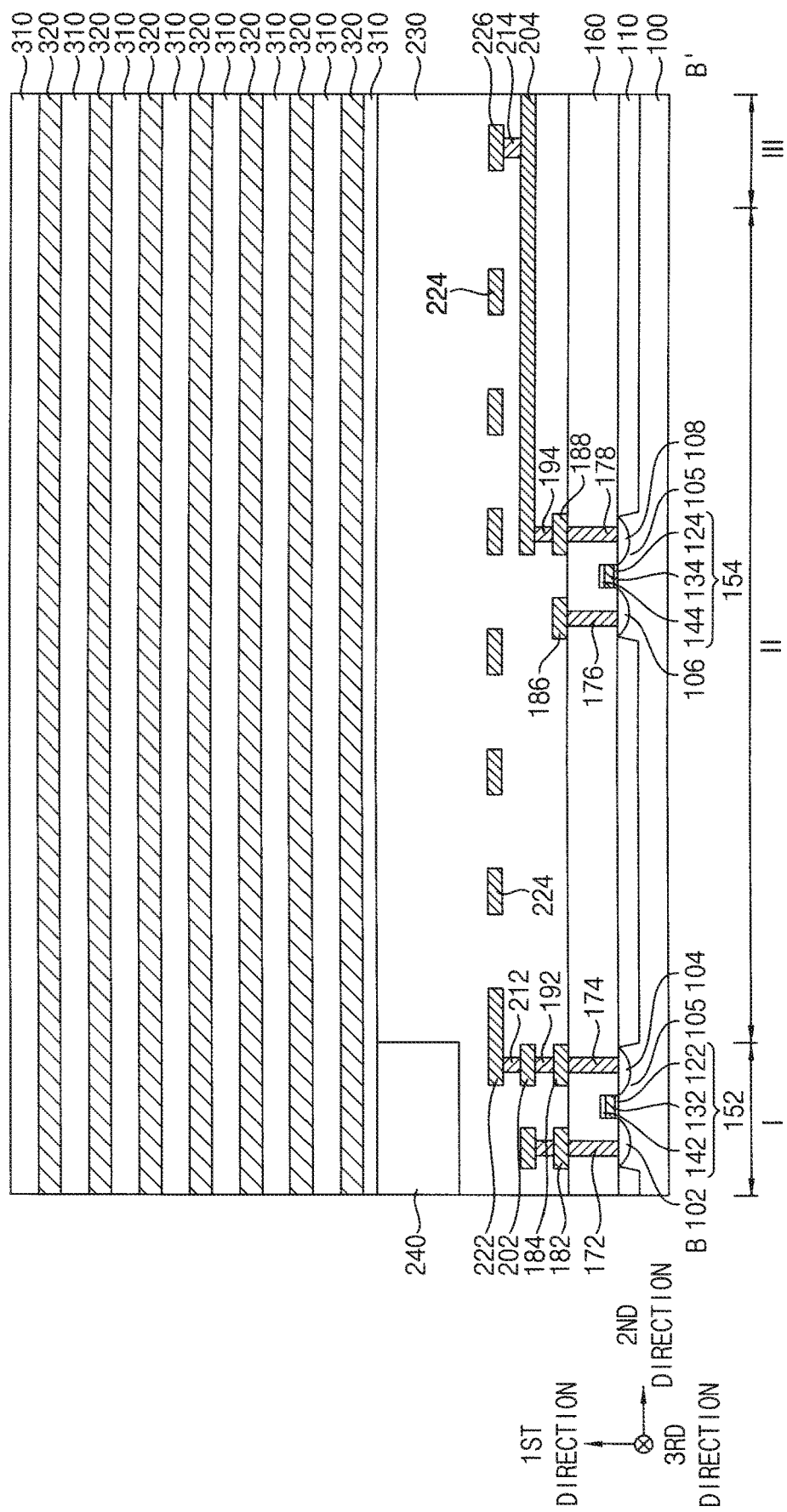

Referring to FIG. 9, a first insulation layer 310 and a sacrificial layer 320 may be alternately and repeatedly stacked on the base pattern 240 and the second insulating interlayer 230. Accordingly, a plurality of first insulating interlayers 320 and a plurality of sacrificial layers 320 may be alternately stacked in the first direction.

The first insulation layer 310 and the sacrificial layer 320 may be formed by, e.g., a CVD process, a plasma enhanced chemical vapor deposition (PECVD) process, an ALD process, etc.

The sacrificial layer 320 may include a material having an etching selectivity with respect to the first insulation layer 310, e.g., a nitride such as silicon nitride.

Figure 10:
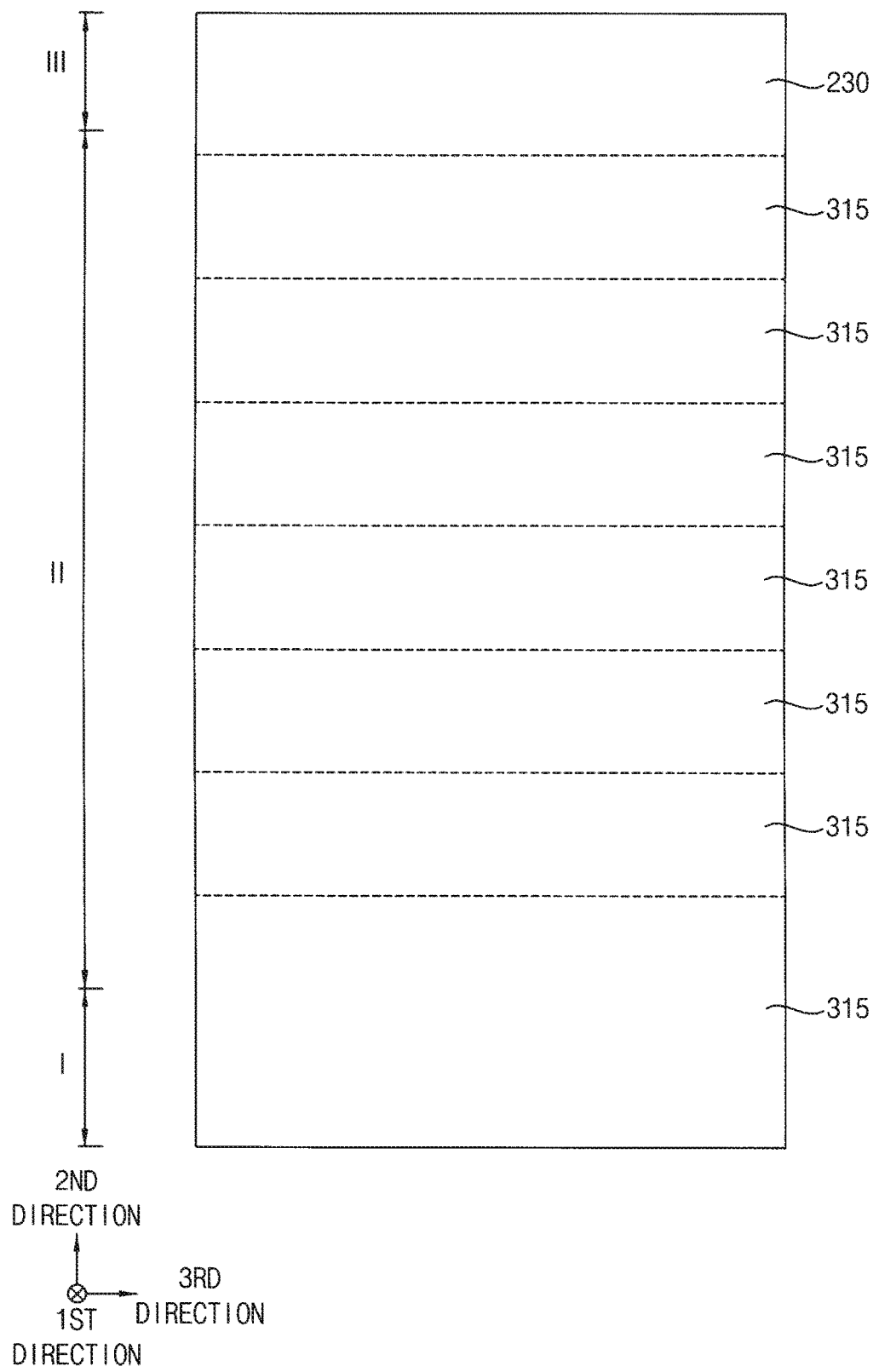
Figure 11:
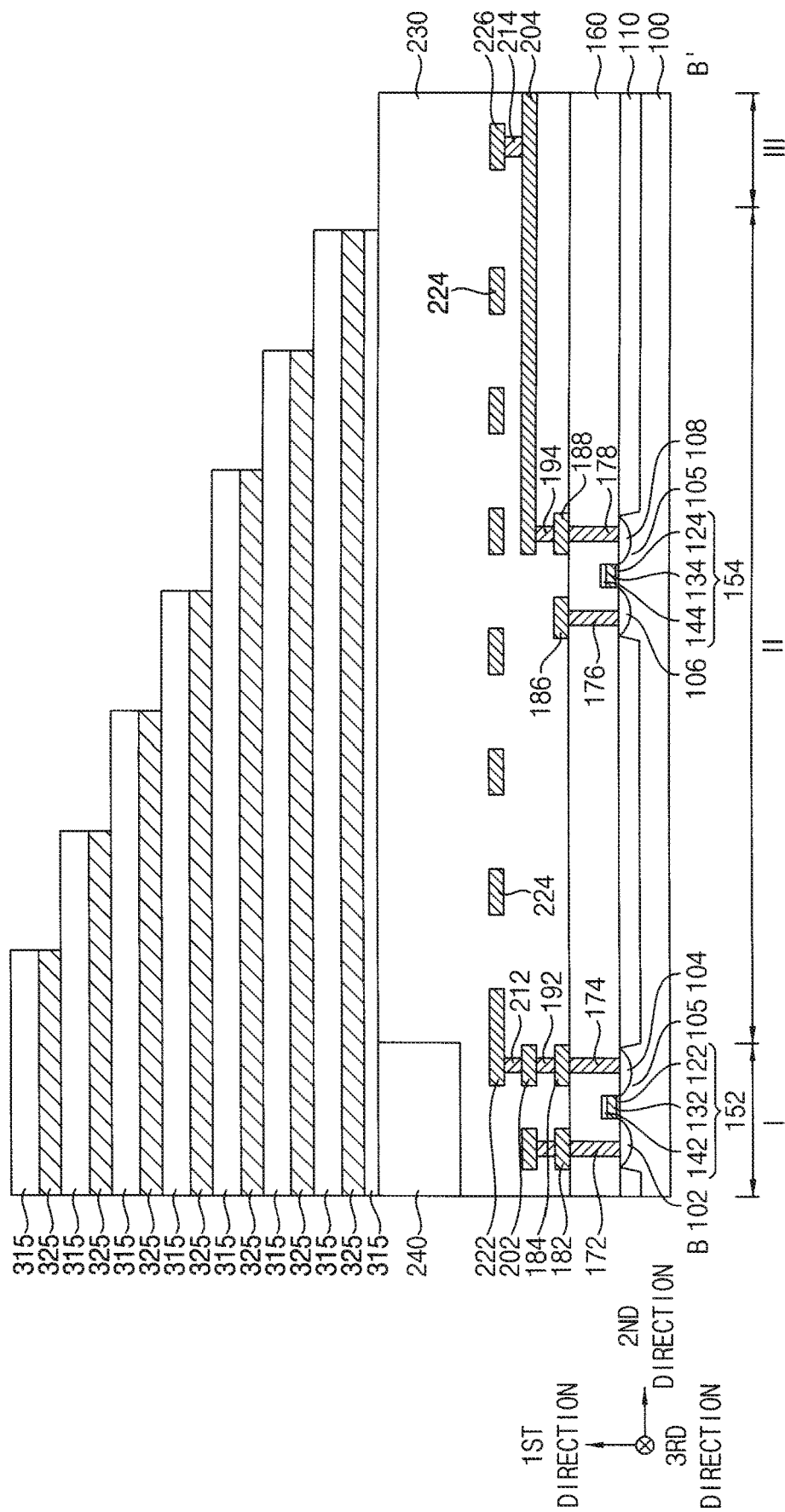

Referring to FIGS. 10 and 11, a photoresist pattern (not shown) partially covering an uppermost one of the first insulation layers 310 may be formed on the uppermost one of the first insulation layers 310, and the uppermost one of the first insulation layers 310 and an uppermost one of the sacrificial layers 320 thereunder may be etched using the photoresist pattern as an etching mask. Accordingly, a portion of one of the first insulation layers 310 directly under the uppermost one of the sacrificial layers 320 may be exposed.

After reducing an area of the photoresist pattern by a given ratio, a trimming process in which the uppermost one of the first insulation layers 310, the uppermost one of the sacrificial layers 320, the exposed one of the first insulation layers 310 and one of the sacrificial layers 320 thereunder may be etched using the reduced photoresist pattern as an etching mask, may be performed. As the trimming process is repeatedly performed, a mold including a plurality of steps which may include a sacrificial pattern 325 and a first insulation pattern 315 sequentially stacked and having a staircase shape may be formed. Hereinafter, each of the steps may be considered to include not only exposed portions, but also portions covered by upper level steps, and thus may refer to an entire portion of the sacrificial pattern 325 and an entire portion of the first insulation pattern 315 at the same level.

The mold may be formed on the first and second regions I and II of the substrate 100. In this case, an exposed portion of each step in the mold may be formed in the second region II of the substrate 100.

In example embodiments, the steps included in the mold may have lengths extending in each of the second and third directions, which may gradually decrease from a lowermost one toward an uppermost one thereof.

Figure 12:
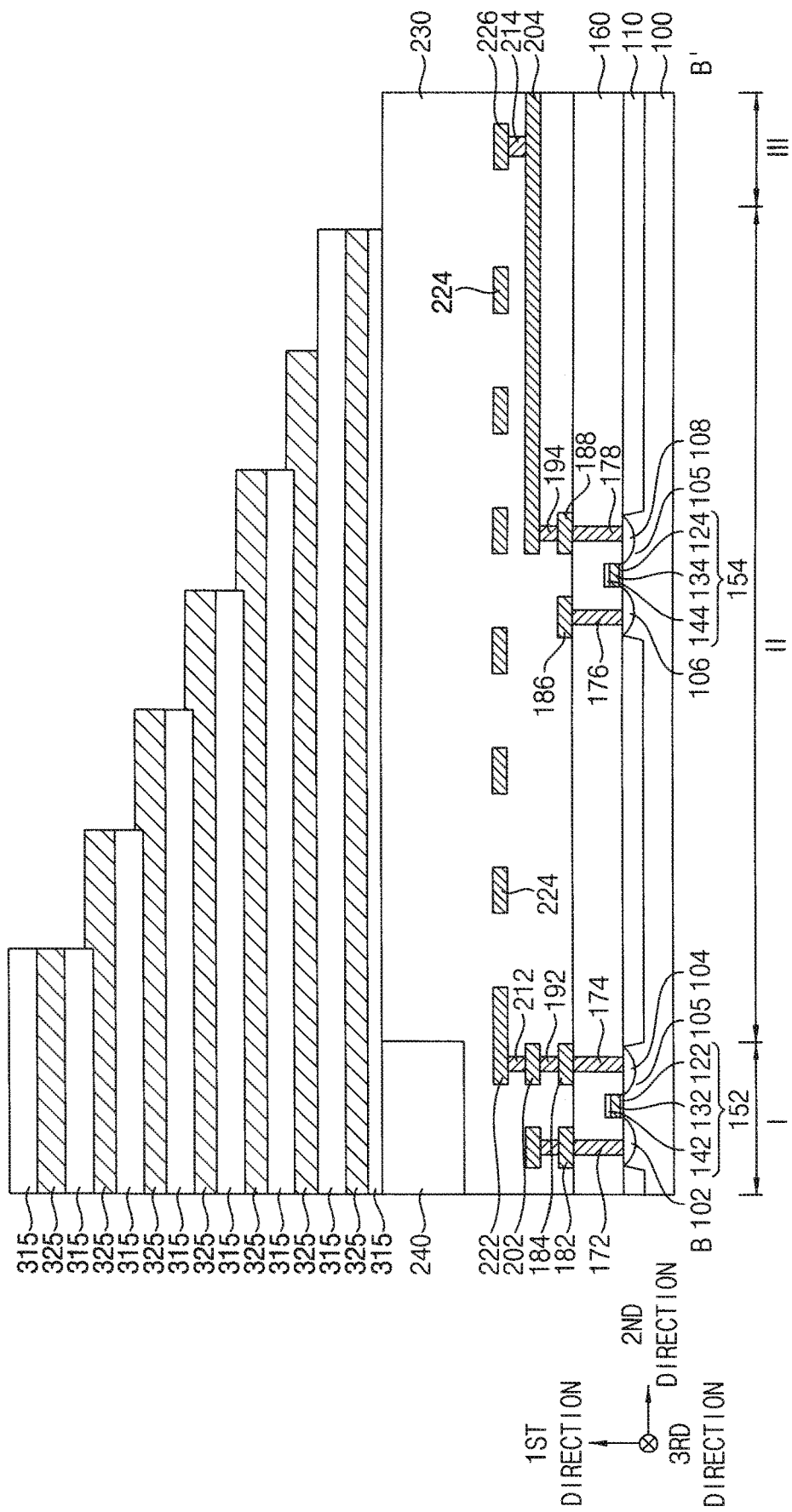

Referring to FIG. 12, a thickness of an end portion in the second direction of at least one of the sacrificial patterns 325 may be increased.

In one embodiment, an end portion of the first insulation pattern 315 included in an exposed portion of each of the steps may be removed to expose an end portion of the sacrificial pattern 325 in each of the steps, a layer including substantially the same material as that of the sacrificial pattern 325 may be further formed on the first insulation pattern 315 and the exposed end portion of the sacrificial pattern 325 in each of the steps by a deposition process having a low step coverage characteristic, and an etch back process may be performed there on, so that the thickness of the end portion in the second direction of each of the sacrificial patterns 325 may be increased. Accordingly, the end portion in the second direction of each of the sacrificial patterns 325 may have an upper surface higher than those of other portions thereof.

FIG. 12 shows increased thicknesses of the end portions of all sacrificial patterns 325 except for a lowermost one and an uppermost one, however, the inventive concepts may not be limited thereto, and for example, the thicknesses of the end portions of all sacrificial patterns 325 may be increased.

Figure 13:
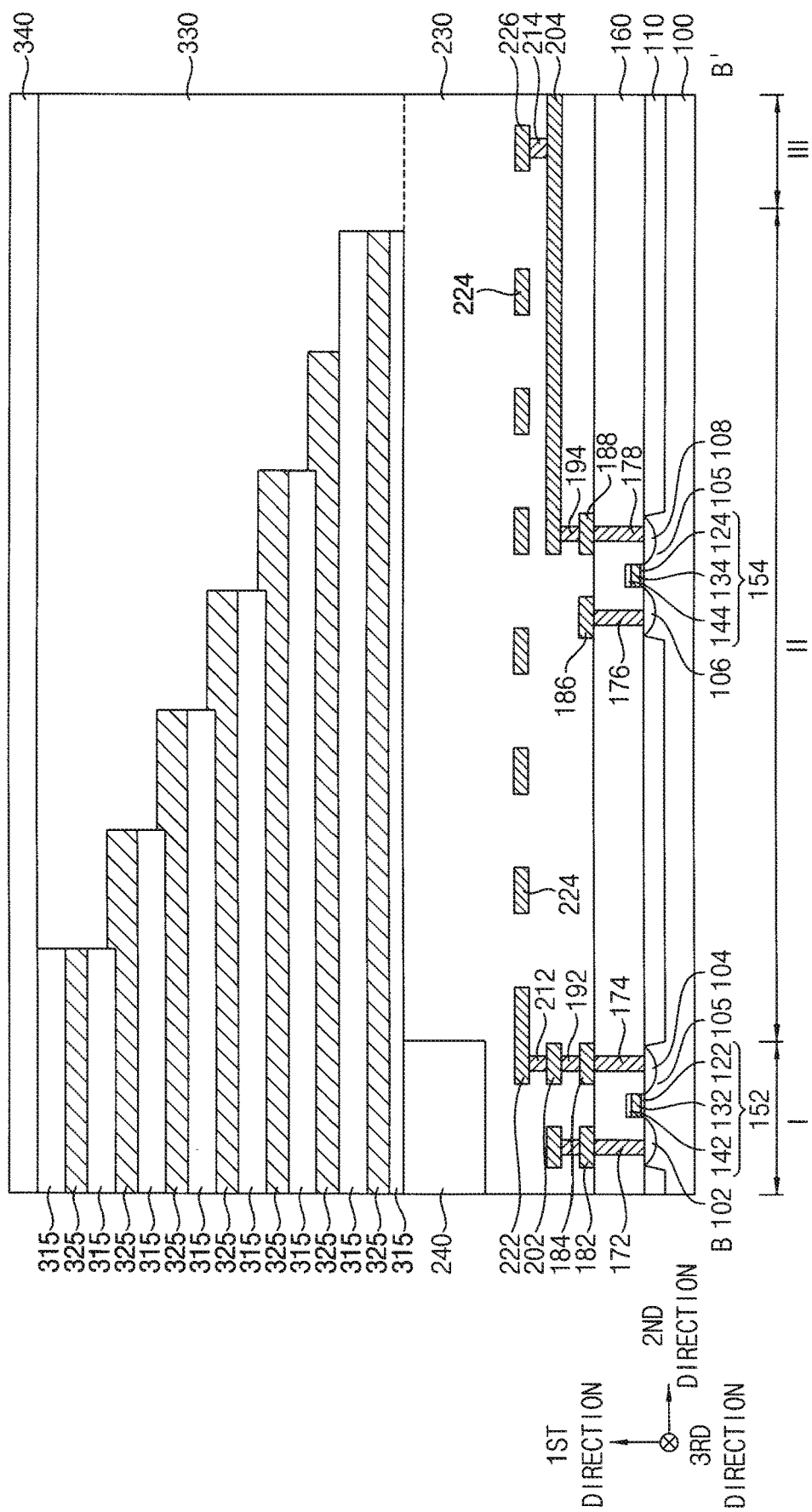

Referring to FIG. 13, a fourth insulating interlayer may be formed on the second insulating interlayer 230 to cover the mold, and may be planarized until an upper surface of the uppermost one of the first insulation patterns 315 may be exposed to form a fourth insulating interlayer pattern 330 covering a sidewall of the mold. The fourth insulating interlayer pattern 330 may be merged with the second insulating interlayer 230 and/or the first insulation pattern 315.

A fifth insulating interlayer 340 may be formed on an upper surface of the mold and an upper surface of the fourth insulating interlayer pattern 330. The fifth insulating interlayer 340 may be merged with the fourth insulating interlayer pattern 330 and/or the uppermost one of the first insulation patterns 315.

Figure 14:
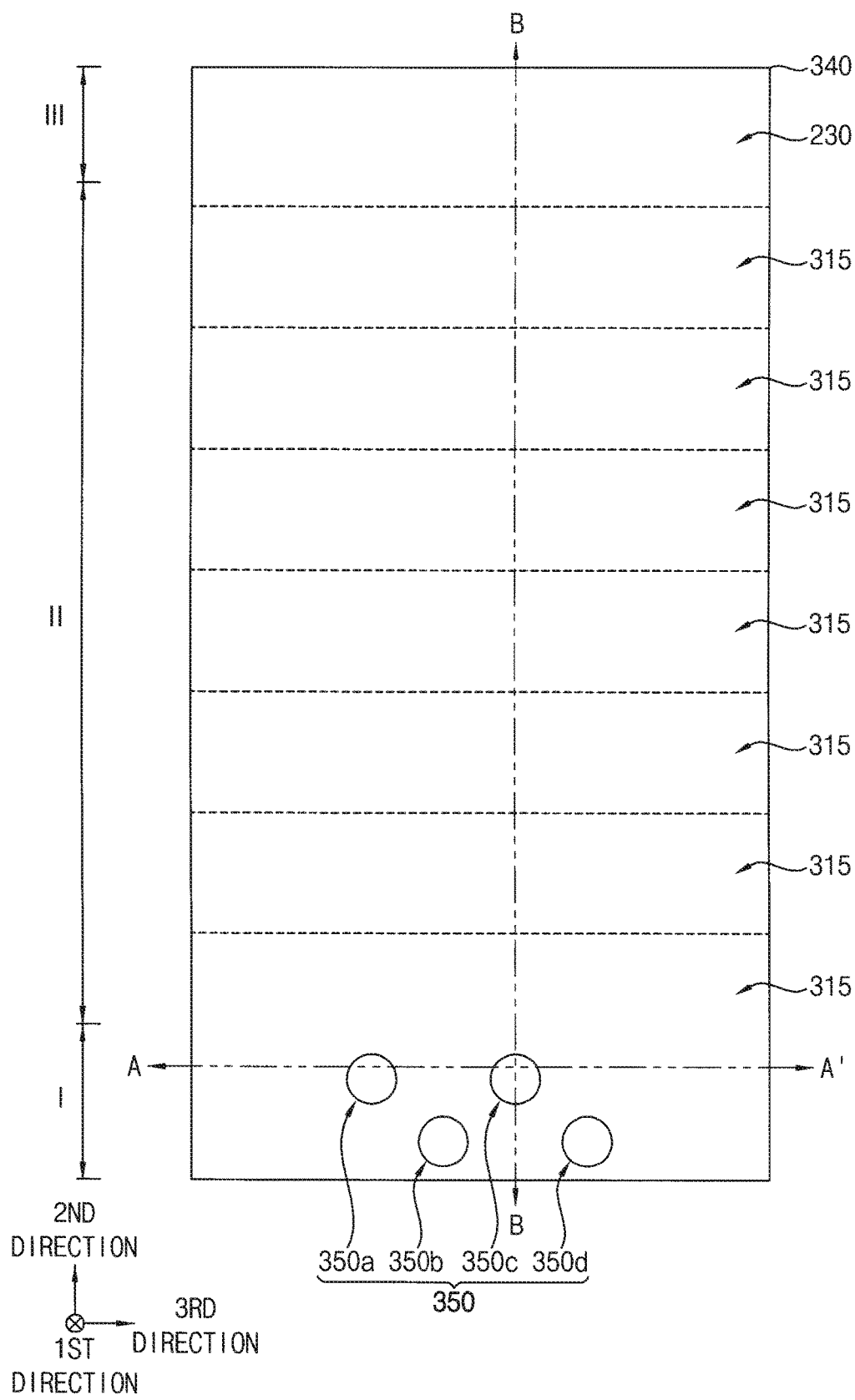

Referring to FIGS. 14 to 16, after forming a first mask (not shown) on the fifth insulating interlayer 340, the fifth insulating interlayer 340, the first insulation patterns 315 and the sacrificial patterns 325 thereunder may be etched using the first mask as an etching mask to form a channel hole 350 through the fifth insulating interlayer 340, the first insulation patterns 315 and the sacrificial patterns 325, which may expose an upper surface of the base pattern 240.

A plurality of channel holes 350 may be formed in each of the second and third direction to define a channel hole array. In one embodiment, the channel hole array may include a plurality of channel hole blocks spaced apart from each other in the third direction, and the channel hole block may include first to fourth channel hole columns 350a, 350b, 350c and 350d sequentially arranged in the third direction in this order.

Figure 19:
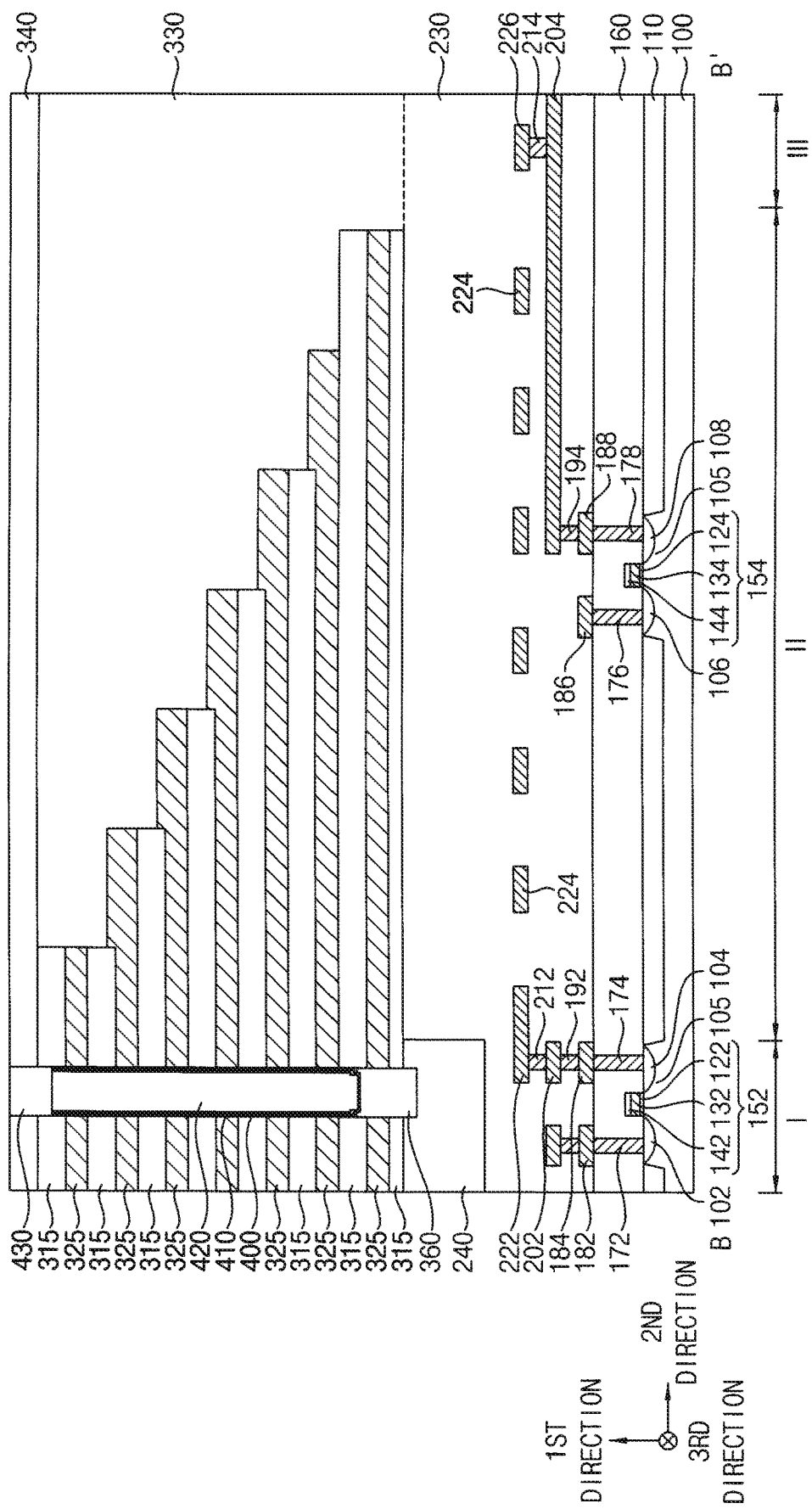

Referring to FIGS. 17 to 19, after removing the first mask, a semiconductor pattern 360 partially filling the channel hole 350 may be formed.

Specifically, a selective epitaxial growth (SEG) process using the upper surface of the base pattern 240 exposed by the channel hole 350 as a seed may be performed to form the semiconductor pattern 360 partially filling the channel hole 350. Accordingly, the semiconductor pattern 360 may include single crystalline silicon or single crystalline germanium depending on a material of the base pattern 240, and may be doped with impurities in some cases.

A first blocking layer, a charge storage layer, a tunnel insulation layer and a first spacer layer (not shown) may be sequentially formed on sidewalls of the channel holes 350, an upper surface of the semiconductor pattern 360 and an upper surface of the fifth insulating interlayer 340, the first spacer layer may be anisotropically etched to form a first spacer (not shown) only remaining on the sidewalls of the channel holes 350, and the tunnel insulation layer, the charge storage layer and the first blocking layer may be etched using the first spacer as an etching mask to form a tunnel insulation pattern 390, a charge storage pattern 380 and a first blocking pattern 370 having a cup-like shape of which a central lower surface is opened on the semiconductor pattern 360 and each of the sidewalls of the channel holes 350. During the etching process, an upper portion of the semiconductor pattern 360 may be also partially removed. The tunnel insulation pattern 390, the charge storage pattern 380 and the first blocking pattern 370 may form a charge storage structure 400.

The first blocking pattern 270 and the tunnel insulation pattern 290 may include an oxide, e.g., silicon oxide, and the charge storage pattern 280 and the first spacer may include a nitride, e.g., silicon nitride.

After removing the first spacer, a channel layer may be formed on the exposed semiconductor pattern 360, the tunnel insulation pattern 390 and the fifth insulating interlayer 340, and a filling layer may be formed on the channel layer to sufficiently fill remaining portions of the channel holes 350.

The filling layer and the channel layer may be planarized until an upper surface of the fifth insulating interlayer 340 may be exposed to form a filling pattern 420 filling the remaining portion of each of the channel holes 350, and the channel layer may be transformed into a channel 410.

Accordingly, the charge storage structure 400, the channel 410 and the filling pattern 420 may be sequentially stacked on the semiconductor pattern 360 in each of the channel holes 350.

The channel holes 350 in which the channel 410 may be formed may define the channel hole block including the first to fourth channel hole columns 350a, 350b, 350c and 350d, and also define the channel hole array, and thus the channel 410 may also define a channel block and a channel array corresponding thereto.

An upper portion of a first structure including the filling pattern 420, the channel 410 and the charge storage structure 400 may be removed to form a trench (not shown), and a capping pattern 430 may be formed to fill the trench.

Specifically, the upper portion of the first structure may be removed to form the trench by an etch back process, the capping pattern filling the trench may be formed on the first structure and the fifth insulating interlayer 340, an upper portion of the capping layer may be planarized until the upper surface of the fifth insulating interlayer 340 may be exposed, and thus the capping pattern 430 may be formed. The first structure, the semiconductor pattern 360 and the capping pattern 430 in each of the channel holes 350 may define a second structure.

Figure 20:
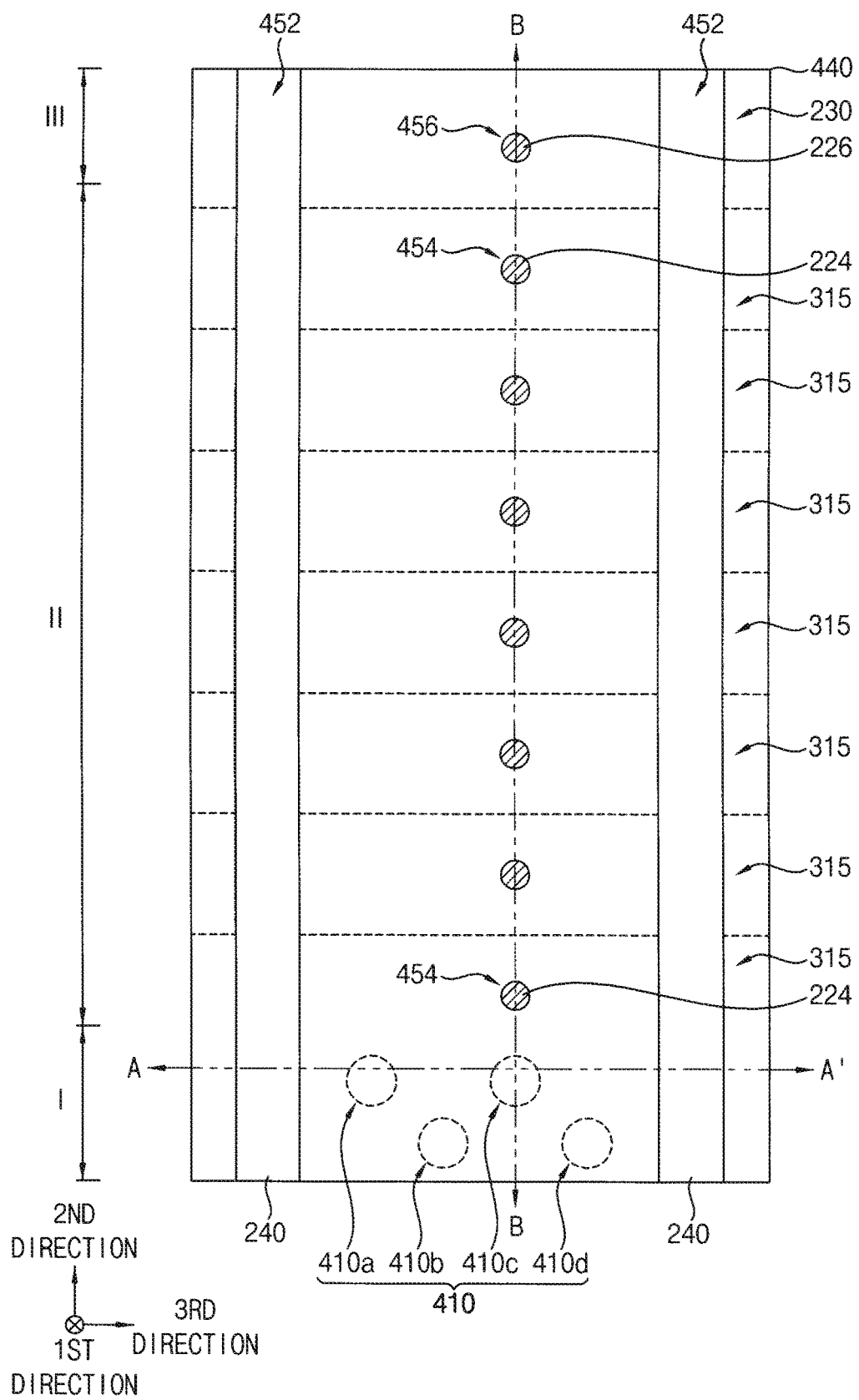
Figure 21:
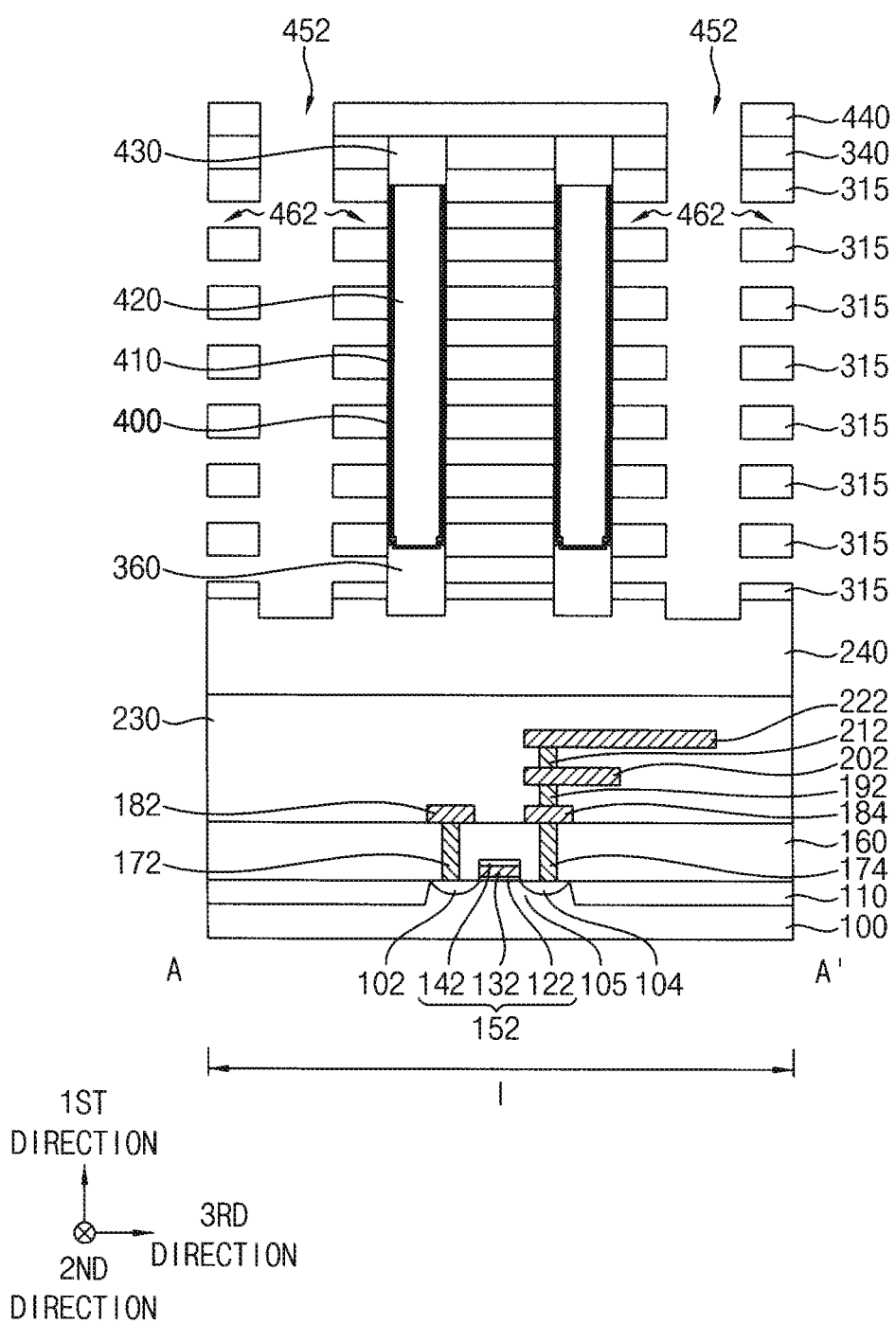
Figure 22:
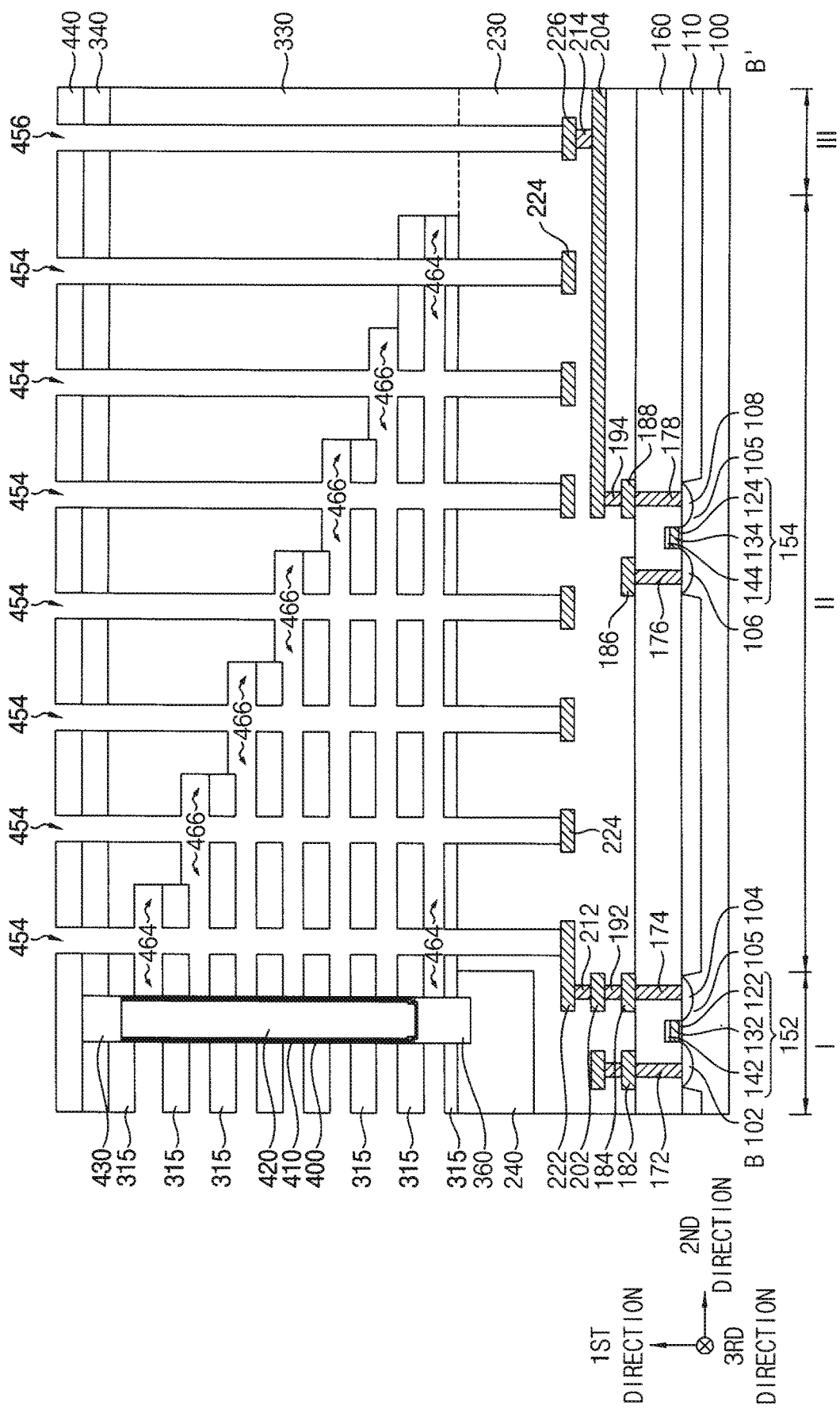

Referring to FIGS. 20 to 22, a sixth insulating interlayer 440 may be formed on the fifth insulating interlayer 340 and the capping pattern 430.

After forming a second mask (not shown) on the sixth insulating interlayer 440, a first opening 452 extending through the fifth and sixth insulating interlayers 340 and 440, the first insulation patterns 315 and the sacrificial patterns 325 to expose the upper surface of the base pattern 240, a second opening 454 extending through the fifth and sixth insulating interlayers 340 and 440, the fourth insulating interlayer pattern 330, the first insulation patterns 315, the sacrificial patterns 325 and the second insulating interlayer 230 to expose an upper surface of the eighth lower wiring 224, and a third opening 456 extending through the second, fifth and sixth insulating interlayers 230, 340 and 440 and the fourth insulating interlayer pattern 330 to expose an upper surface of the ninth lower wiring 226 may be formed using the second mask as an etching mask. The sixth insulating interlayer 440 may be merged with the fifth insulating interlayer 340 thereunder.

In example embodiments, the first opening 452 may be formed to extend in the second direction between the channel blocks on the first and second regions I and II of the substrate 100, and thus a plurality of first openings 452 may be formed in the third direction. That is, one channel block including four channel columns therein may be formed between two first openings 452 adjacent with each other. However, the inventive concepts may not be limited thereto.

In example embodiments, the second opening 454 may extend through end portions of the sacrificial patterns 325 on the second region II of the substrate 100 to expose the upper surface of the eighth lower wiring 224, and thus a plurality of second openings 454 may be formed in the third direction. FIG. 20 shows the second openings 454 are formed in a straight line in the second direction between ones of the first openings 452 adjacent to each other in the third direction. However, the inventive concepts may not be limited thereto, and for example, the second openings 454 may be formed in a zigzag pattern in the second direction.

In example embodiments, each of the second openings 454 may extend through an end portion of a corresponding sacrificial pattern 325, and may extend through end portions of other sacrificial patterns 325 at lower levels.

The third opening 456 may be formed on the third region III of the substrate 100 to expose the upper surface of the ninth lower wiring 226. FIG. 22 shows one third opening 456, however, the inventive concepts may not be limited thereto.

After removing the second mask, the sacrificial patterns 325 exposed by the first and second openings 452 and 454 may be removed to form a first gap 462 between neighboring ones of the first insulation patterns 315 in the first direction, and a portion of an outer sidewall of the first blocking pattern 370 and a portion of a sidewall of the semiconductor pattern 360 may be exposed by the first gap 462. In example embodiments, the sacrificial patterns 325 exposed by the first opening 452 may be removed by a wet etching process using an etchant including phosphoric acid or sulfuric acid.

The second openings 454 may be formed in the second direction between ones of the first openings 452 adjacent to each other in the third direction, and thus the sacrificial patterns 325 may be easily removed even with no additional openings between the first openings 452.

Hereinafter, one or ones of the first gaps 462 adjacent the second opening 454 may be referred to as a second gap 464, and particularly, one(s) of the first gaps 462 that may be formed by removing the end portion(s) of ones of the sacrificial patterns 325 having increased thicknesses may be referred to as a third gap 466. Other ones of the first gaps 462 except for the second and third gaps 464 and 466 may be referred to as the first gap 462. That is, the third gap 466 may have an upper surface higher than and a lower surface substantially coplanar with those of the first and second gaps 462 and 464 at the same level.

Impurities may be implanted into at an upper portion of the base pattern 240 exposed by the first opening 452 to form a fifth impurity region 255.

Figure 23:
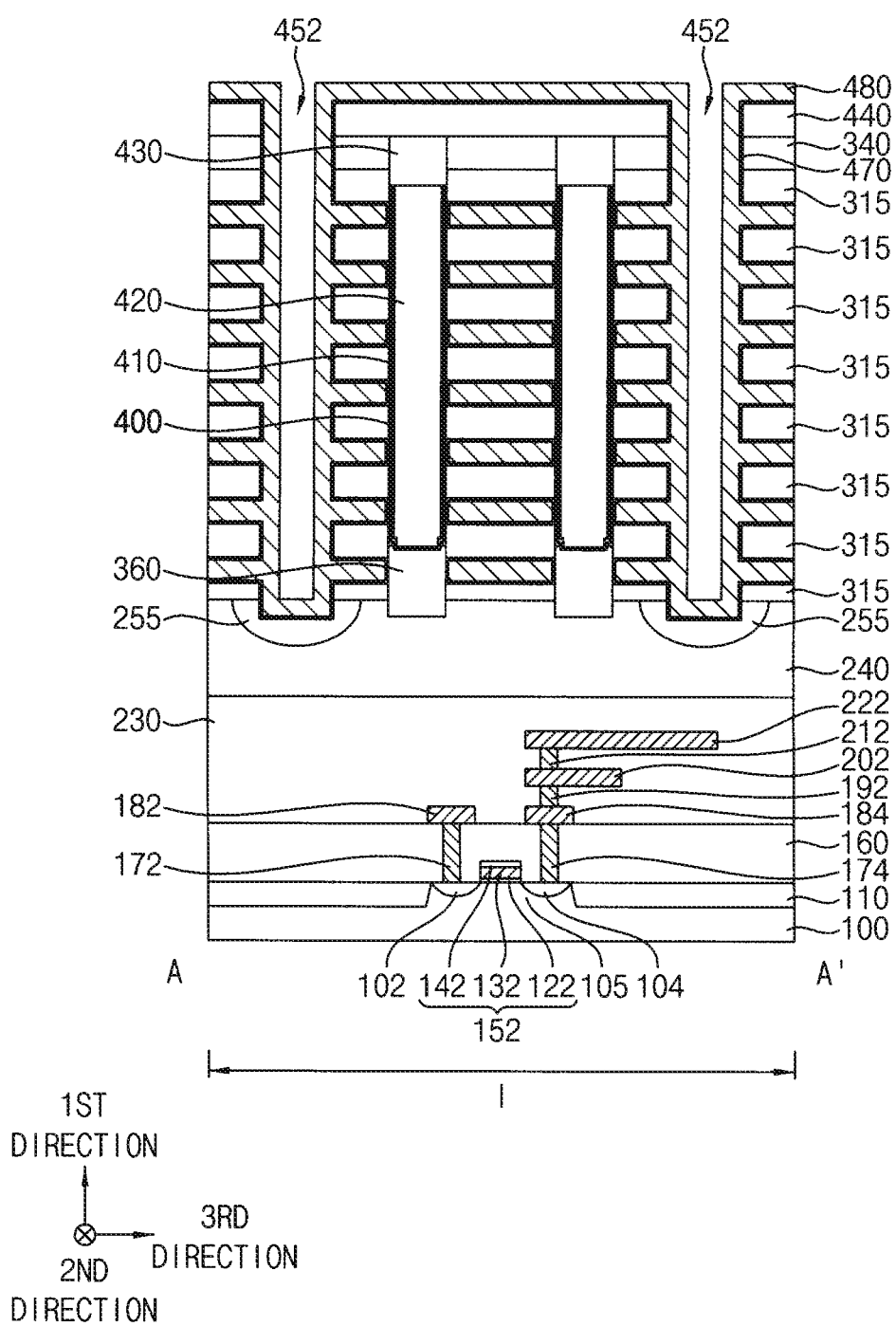
Figure 24:
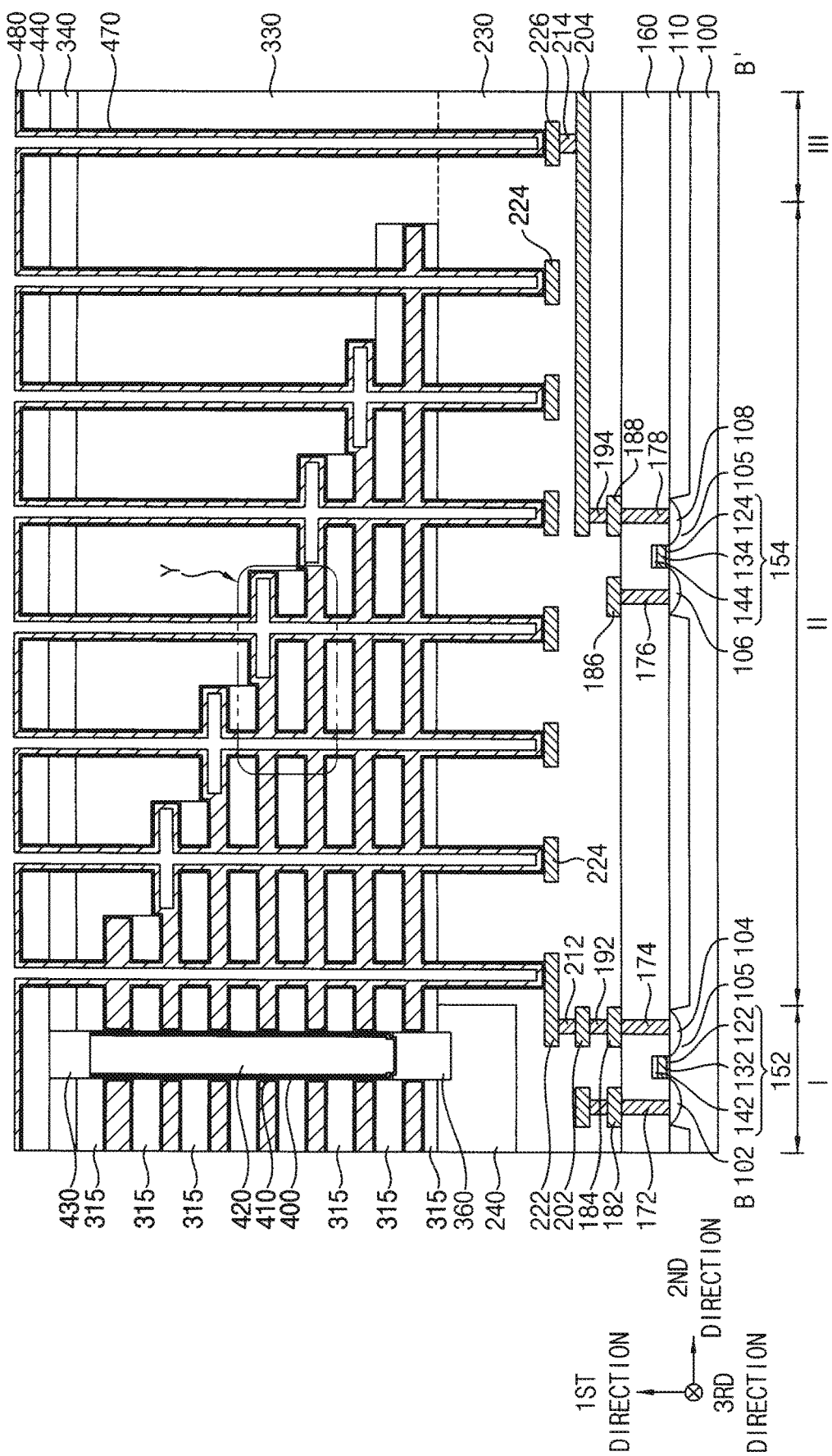
Figure 25:
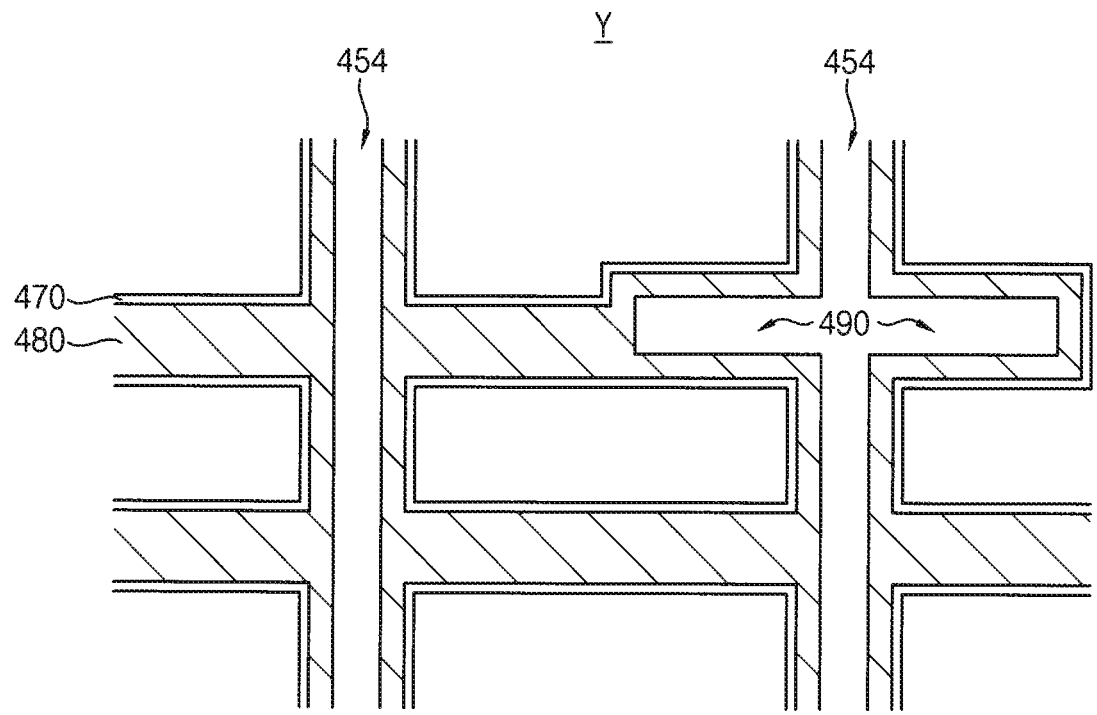

Referring to FIGS. 23 to 25, after forming a second blocking layer 470 on sidewalls of the first to third openings 452, 454 and 456, the exposed outer sidewall of the first blocking pattern 370, the exposed sidewall of the semiconductor pattern 360, inner walls of the first to third gaps 462, 464 and 466, an upper surface of the base pattern 240, the exposed upper surfaces of the eighth and ninth lower wirings 224 and 226 and an upper surface of the sixth insulating interlayer 440, a first conductive layer 480 may be formed on the second blocking layer 470 to fill a remaining portion of the first and second gaps 462 and 464. A barrier layer (not shown) may be further formed between the second blocking layer 470 and the first conductive layer 480.

The third gap 466 having a relatively large thickness may not be fully filled by the first conductive layer 480, and thus a first recess 490 may be formed.

Figure 26:
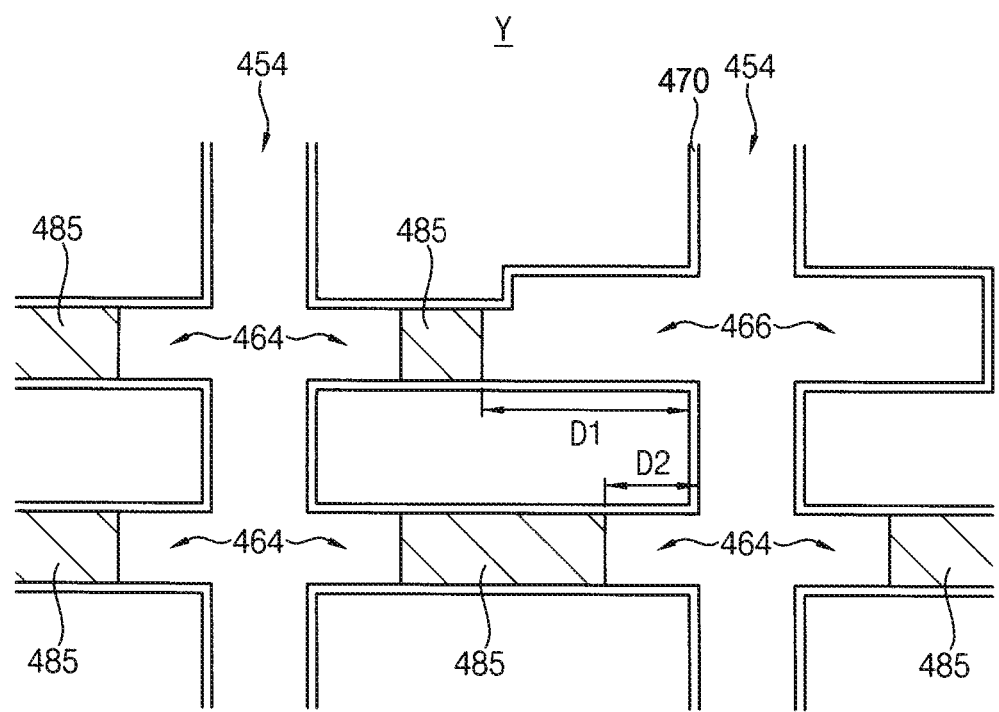

Referring to FIG. 26, portions of the first conductive layer 480 in the first to third openings 452, 454 and 456 and portions of the first to third gaps 462, 464 and 466 adjacent thereto may be removed to form a first conductive pattern 485 in the first and second gaps 462 and 464. As described above, when the first barrier layer is further formed, a first barrier pattern (not shown) covering lower and upper surfaces and a sidewall of the first conductive pattern 485 may be further formed. In example embodiments, the portions of the first conductive layer 480 may be removed by a wet etching process.

In example embodiments, the first conductive pattern 485 may extend in the second direction on the first and second regions I and II of the substrate 100, and a plurality of first conductive patterns 485 may be formed in the third direction. That is, each of the first conductive patterns 485 extending in the second direction may be spaced apart from each other in the third direction by the first opening 452. However, each of the first conductive patterns 485 extending in the second direction may not be formed in the second opening 454 and portions of the second and third gaps 464 and 466 adjacent thereto.

Particularly, a portion of the first conductive layer 480 in a portion of the third gap 466 adjacent the second opening 454 may be fully removed due to the first recess 490, and a portion of the first conductive layer 480 in a portion of the second gap 464 adjacent the second opening 454 may not fully removed but partially remain. Thus, a first distance D1 from a sidewall of the second opening 454 connected to the third gap 466 to a remaining portion of the first conductive pattern 485 in the second gap 464 may be greater than a second distance D2 from a sidewall of the second opening 454 not connected to the third gap 466 to a remaining portion of the first conductive pattern 485 in the second gap 464.

Figure 27:
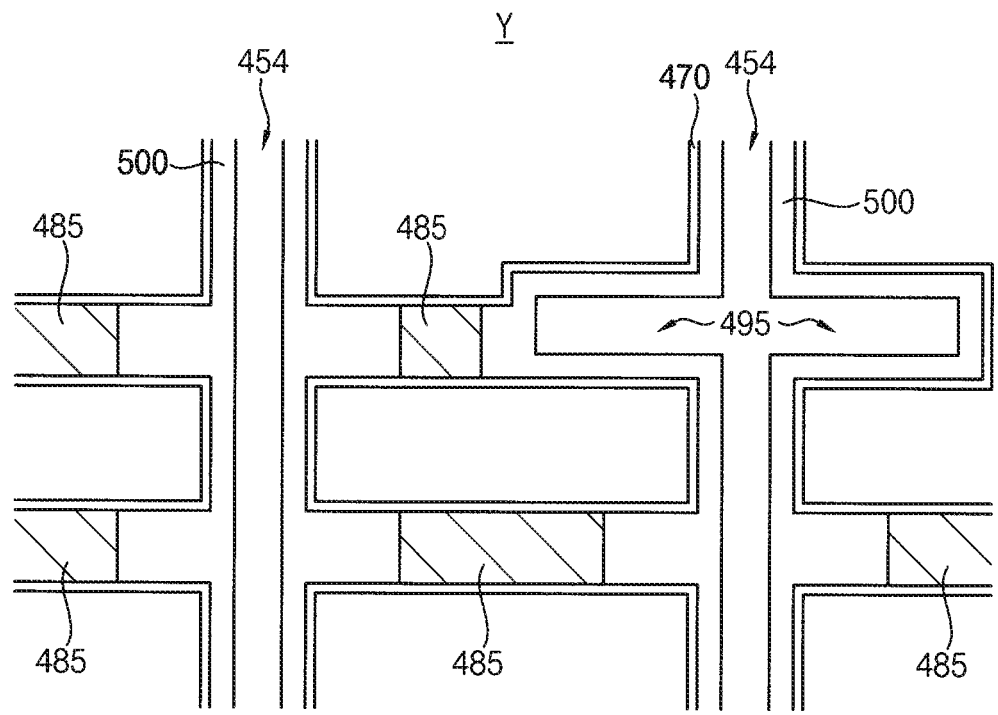

Referring to FIG. 27, a second insulation layer 500 may be formed on sidewalls of the first to third openings 452, 454 and 456 and in the first to third gaps 462, 464 and 466.

In example embodiments, the second insulation layer 500 may fill the first and second gaps 464 and 464, however, may not fully fill the third gap 466 having a relatively large thickness, so that a second recess 495 may be formed therein.

In some embodiments, the second insulation layer 500 may be merged to the first insulation pattern 315.

Figure 28:
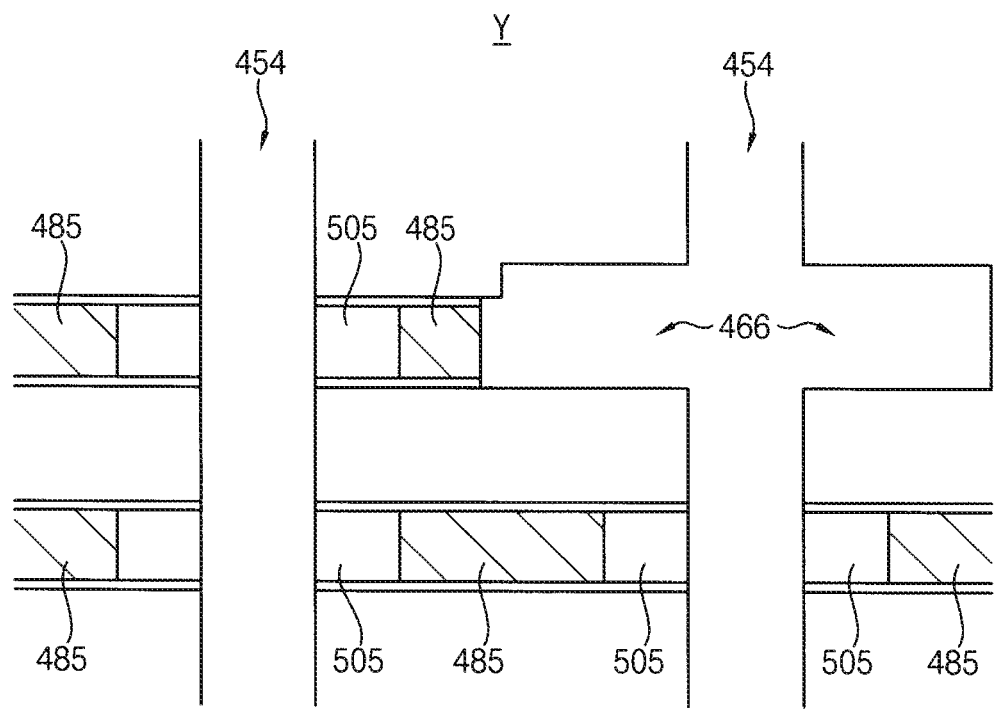
Figure 29:
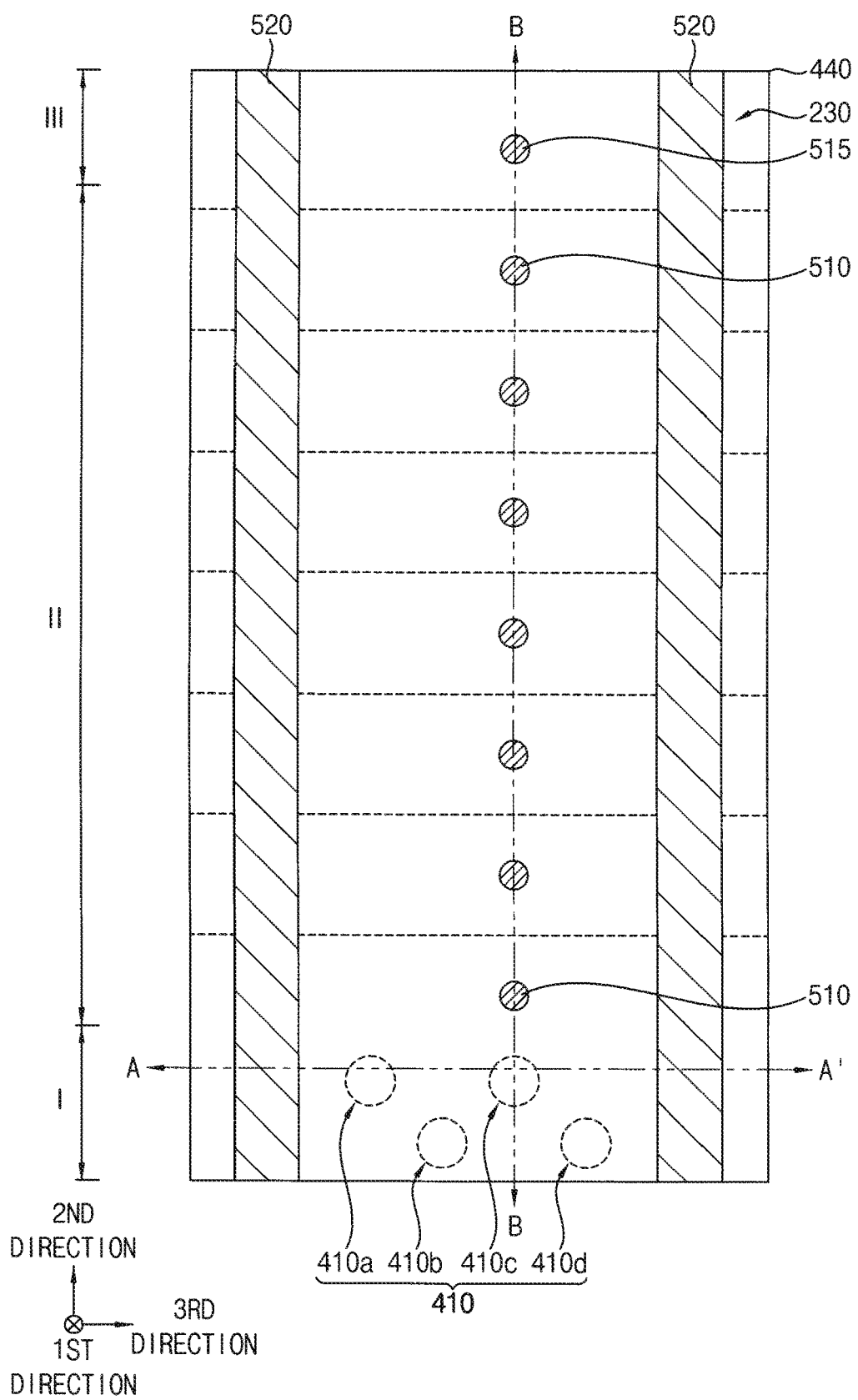
Figure 30:
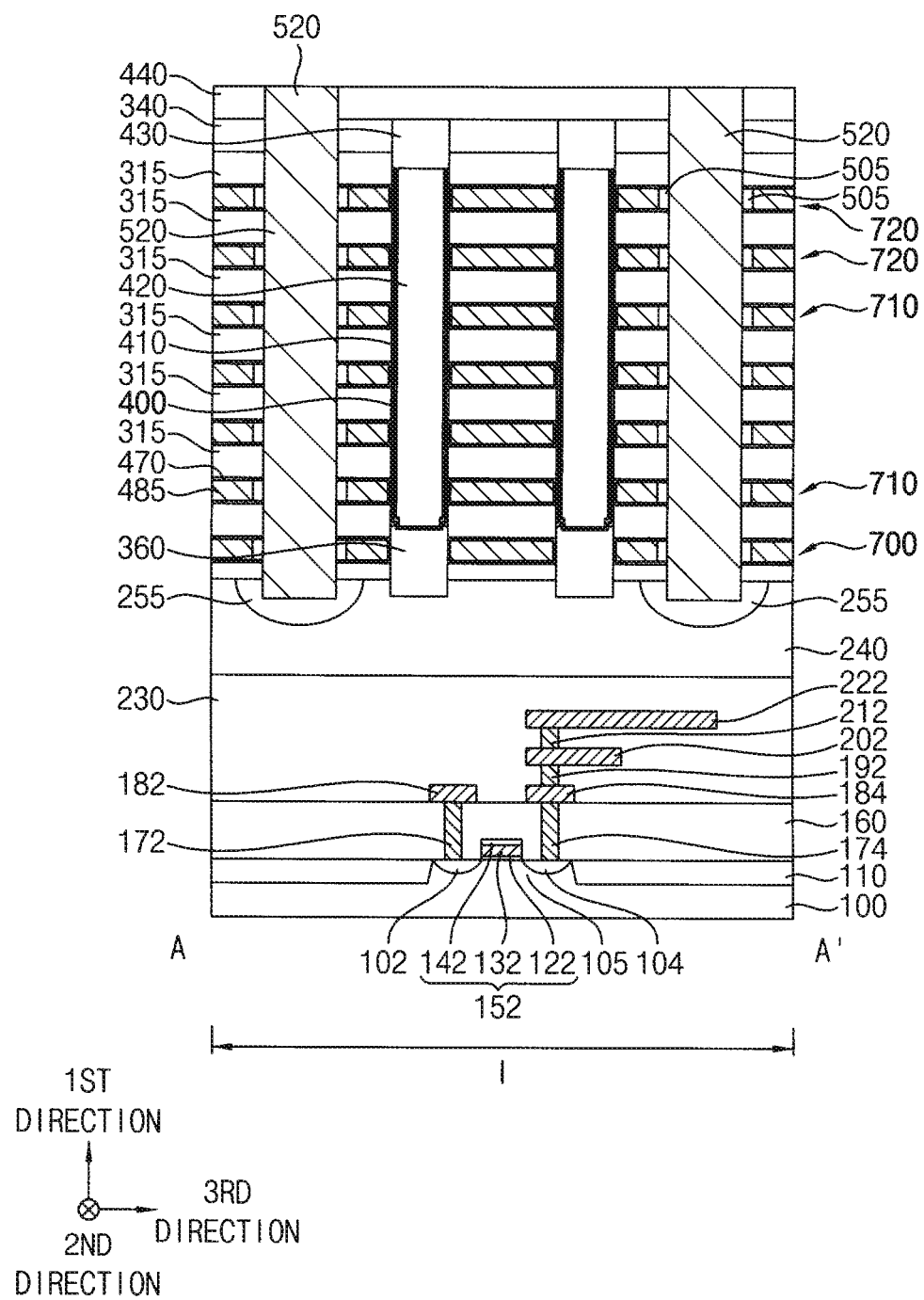
Figure 31:
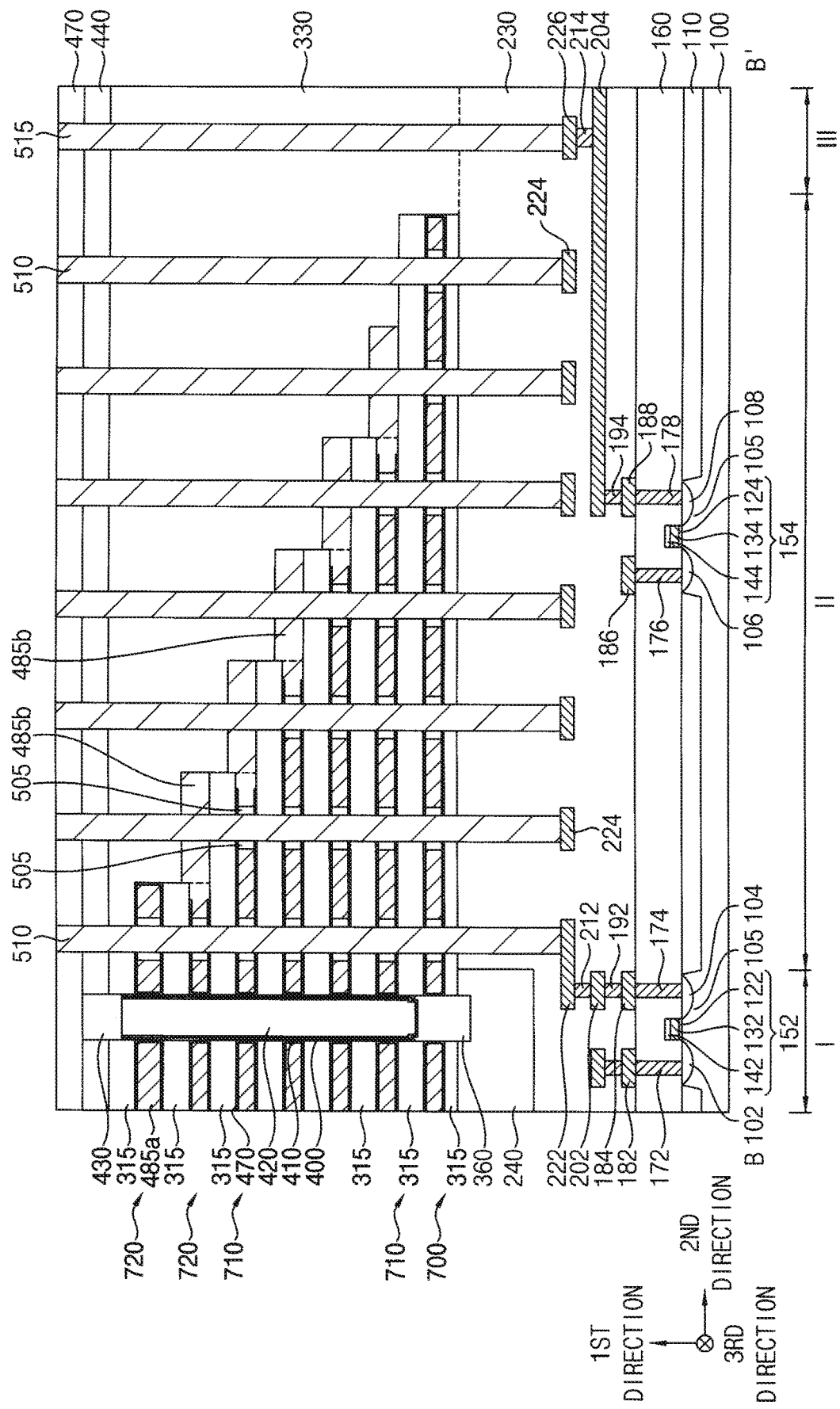

Referring to FIG. 28, portions of the second insulation layer 500 in the first to third openings 452, 454 and 456 and the third gap 466 may be removed to form a second insulation pattern 505 in the first and second gaps 462 and 464.

In example embodiments, a portion of the second insulation layer 500 in the second gap 464 connected to the third gap 466 may be also removed, so that a sidewall of the first conductive pattern 485 may be exposed. However, the second insulation pattern 505 may remain in the second gap 464 not connected to the third gap 466 to cover a sidewall of the first conductive pattern 485.

In example embodiments, the portion of the second insulation layer 500 may be removed by a wet etching process, and the first blocking pattern 370 and the first insulation pattern 315 may be partially removed by the wet etching process, so that a width of each of the first to third openings 452, 454 and 456 may be enlarged.

Referring to FIGS. 29 to 32, a CSL 520 filling the first opening 452, a first upper contact plug 510 filling the second opening 454, the third gap 466 and a portion of the second gap 464, and a second upper contact plug 515 filling the third opening 456 may be formed.

Particularly, a second conductive layer may be formed on the sixth insulating interlayer 440 to fill the first to third openings 452, 454 and 456, and may be planarized until an upper surface of the sixth insulating interlayer 440 may be exposed to form the CSL 520 and the first and second upper contact plugs 510 and 515. Before forming the second conductive layer, a second barrier layer may be further formed on sidewalls of the first to third openings 452, 454 and 456, and in this case, each of the first and second upper contact plugs 510 and 515 may include a second barrier pattern (not shown).

In example embodiments, the CSL 520 may extend in the second direction to separate the first conductive pattern 485 at the same level, however, both sidewalls of the CSL 520 may be covered by the first and second insulation patterns 315 and 505 to be electrically insulated from the first conductive pattern 485. The CSL 520 may contact an upper surface of the fifth impurity region 255 at an upper portion of the base pattern 240 to be electrically connected thereto.

In example embodiments, the first upper contact plug 510 may fill the second opening 454, and further fill the third gap 466 connected to the second opening 454 and a portion of the second gap 464 connected to the third gap 466. Thus, the first upper contact plug 510 may directly contact a sidewall of the first conductive pattern 485. However, the first upper contact plug 510 may directly contact one of the first conductive patterns 485 at a level, and may not directly contact ones of the first conductive patterns 485 at lower levels, due to the second insulation pattern 505.

In example embodiments, the first upper contact plug 510 may include a first extension portion 510a, which may extend in the first direction to contact an upper surface of the eighth lower wiring 224, and a second extension portion 510b, which may be formed at each of opposite sides of the first extension portion 510a in the second direction to directly contact the first extension portion 510a and extend in the third direction between neighboring ones of the CSLs 520. A portion of the second extension portion 510b adjacent the first extension portion 510a may have an upper surface higher than that of a portion of the second extension portion 510b adjacent the first conductive pattern 485, and may have a thickness greater than that of the first conductive pattern 485. Thus, the second extension portion 510b may have a staircase shape.

Referring to FIG. 33, the second extension portion 510b of the first upper contact plug 510 may be merged with the first conductive pattern 485.

When the first upper contact plug 510 includes substantially the same material as that of the first conductive pattern 485, the second extension portion 510b of the first upper contact plug 510 may be merged with the first conductive pattern 485 so as to serve as a gate electrode.

The first upper contact plug 510 may extend through and contact an end portion of the gate electrode in the second direction, and hereinafter, the end portion of the gate electrode may be referred to as a pad 485b. Hereinafter, the first conductive pattern 485 may be indicated by reference numeral 485a, and the first conductive pattern 485a and the pad 485b may form the gate electrode 485. In example embodiments, the pad 485b of at least one of the gate electrodes 485 at a plurality of levels, respectively, may have an upper surface higher than the first conductive pattern 485a thereof, so as to have a relatively great thickness.

As shown in FIG. 32, when the second extension portion 510b of the first upper contact plug 510 is not merged with but divided from the first conductive pattern 485, the gate electrode 485 may include only the first conductive pattern 485a.

The gate electrode 485 may include first, second and third gate electrodes 700, 710 and 720 sequentially stacked in the first direction.

The second upper contact plug 515 may extend in the first direction, and may contact an upper surface of the ninth lower wiring 226.

Referring to FIGS. 1 to 3 again, a seventh insulating interlayer 530 may be formed on the sixth insulating interlayer 440, the CSL 520 and the first and second upper contact plugs 510 and 515, and a third upper contact plug 540 extending through the sixth and seventh insulating interlayers 440 and 530 to contact an upper surface of the capping pattern 430, a fourth upper contact plug 542 extending through the seventh insulating interlayer 530 to contact an upper surface of the CSL 520, and fifth and sixth upper contact plugs 544 and 546 extending through the seventh insulating interlayer 530 to contact upper surfaces of the first and second upper contact plugs 510 and 515, respectively, may be formed. The seventh insulating interlayer 530 may be merged with the sixth insulating interlayer 440.

An eighth insulating interlayer 550 may be formed on the seventh insulating interlayer 530 and the third to sixth upper contact plugs 540, 542, 544 and 546, and first to fourth upper wirings 560, 562, 564 and 566 extending through the eighth insulating interlayer 550 to contact upper surfaces of the third to sixth upper contact plugs 540, 542, 544 and 546, respectively, may be formed. In example embodiments, the first to fourth upper wirings 560, 562, 564 and 566 may be formed by a damascene process.

A ninth insulating interlayer 570 may be formed on the eighth insulating interlayer 550 and the first to fourth upper wirings 560, 562, 564 and 566, and a first upper via 580, a second upper via (not shown), a third upper via 584 and a fourth upper via 586 extending through the ninth insulating interlayer 570 to contact upper surfaces of the first to fourth upper wirings 560, 562, 564 and 566, respectively, may be formed.

A tenth insulating interlayer 590 may be formed on the ninth insulating interlayer 570 and the first, third and fourth upper vias 580, 584 and 586, and a fifth upper wiring 600, a sixth upper wiring (not shown), a seventh upper wiring 604 and an eighth upper wiring 606 extending through the tenth insulating interlayer 590 to contact upper surfaces of the first upper via 580, the second upper via, the third upper via 584 and the fourth upper via 586, respectively, may be formed.

Additional upper wirings may be further formed to complete the fabrication of the vertical memory device.

As illustrated above, in the vertical memory device having a COP structure, the CSL 520 and the first and second upper contact plugs 510 and 515 may be simultaneously formed, and thus the number of process may be reduced. Additionally, each of the first upper contact plugs 510 may not be formed to contact the pad 485b of only one of the gate electrodes 485 to be electrically connected thereto, but may be formed through a plurality of gate electrodes 485. Thus, even if the gate electrodes 485 are formed at a plurality of levels in the first direction, the process for forming the upper contact plugs 485 need not be exactly controlled.

The second openings 454 for forming the first upper contact plugs 510 may be formed between the first openings 452 for forming the gate electrodes 485, and thus additional dummy openings need not be formed in order that the gate electrodes 485 may be easily formed in the first gaps 462. Accordingly, the freedom degree of layout formation of structures on the second region II of the substrate 100 may be increased.

Figure 34:
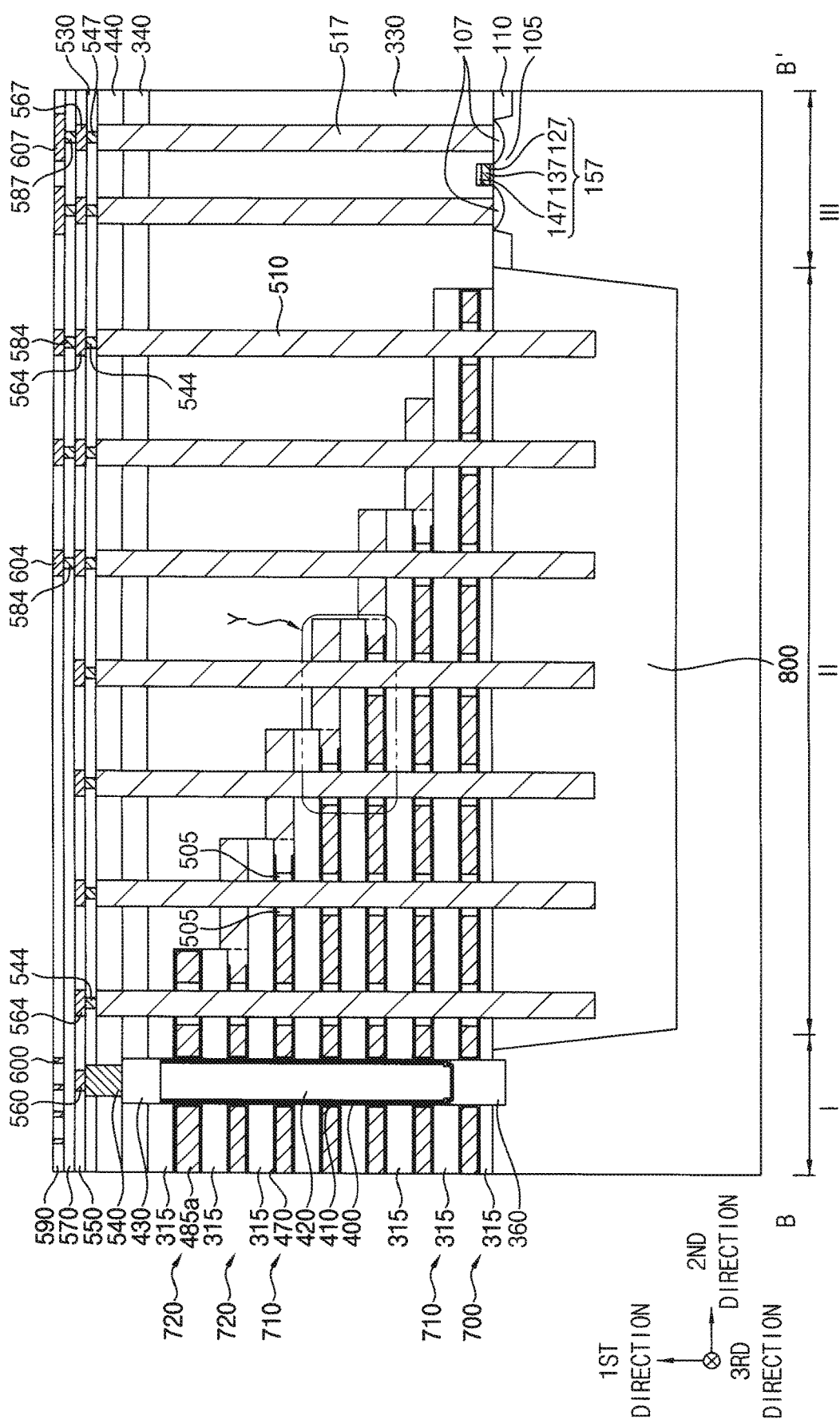
FIG. 34 is a cross-sectional view illustrating a vertical memory device in accordance with example embodiments.

FIG. 34 is a cross-sectional view illustrating a vertical memory device in accordance with example embodiments. This vertical memory device may be substantially the same as or similar to that of FIGS. 1 to 3, except for the COP structure. Thus, like reference numerals refer to like elements, and detailed descriptions thereon are omitted herein.

Referring to FIG. 34, the vertical memory device does not have a COP structure, and thus a peripheral circuit pattern may be formed on the third region III surrounding the first and second regions I and II of the substrate 100.

That is, a third transistor including a third lower gate structure 157 and a sixth impurity region 107 at an upper portion of the active region 105 adjacent thereto may be formed on the third region III of the substrate 100, and the third lower gate structure 157 may include a third lower gate insulation pattern 127, a third lower gate electrode 137 and a third lower gate mask 147 sequentially stacked.

A seventh upper contact plug 517 may extend through the fourth insulating interlayer 330, the fifth and sixth insulating interlayers 340 and 440 to contact the sixth impurity region 107, and an eighth upper contact plug 547, a ninth upper wiring 567, a fifth upper via 587 and a tenth upper wiring 607 may be formed on the seventh upper contact plug 517.

In example embodiments, an etch stop pattern 800 may be formed on the substrate 100 to include an insulating material, and when the second openings 454 for the first upper contact plugs 510 are formed, the etch stop pattern 800 may serve as an etch stop layer.

That is, the first upper contact plugs 510 may not be formed to contact the pad 485 of only one gate electrode 485, and even if the first upper contact plug 510 extends through the gate electrodes 485 at a plurality of levels, the first upper contact plug 510 may be electrically connected to only one gate electrode 485, as shown with reference to FIGS. 1 to 33.

As described above, although example embodiments has been described with reference to some example embodiments, those skilled in the art will readily appreciate that many modifications are possible in the example embodiments without materially departing from the novel teachings and advantages of example embodiments of the present inventive concepts.

What is claimed is:

1. A vertical memory device, comprising:
    gate electrodes on a substrate, the gate electrodes being stacked in a first direction substantially vertical to an upper surface of the substrate, the gate electrodes being stepped in a second direction with an extension length between adjacent ones of the gate electrodes gradually decreasing from a lowermost level toward an uppermost level, the second direction being substantially parallel to the upper surface of the substrate, the gate electrodes including a pad at an end portion thereof in the second direction, the pad having a thickness greater than those of other portions of a respective one of the gate electrodes;
    a channel extending through the gate electrodes in the first direction; and
    a conductive contact plug extending through the gate electrodes in the first direction, the conductive contact plug contacting the pad of a first gate electrode among the gate electrodes such that the conductive contact plug is electrically connected thereto and is electrically insulated from second gate electrodes among the gate electrodes, wherein
        the second gate electrodes are under the first gate electrode, and the conductive contact plug extends through a portion of each of the second gate electrodes, the portion not being the pad.

2. The vertical memory device of claim 1, further comprising:
    a first insulation pattern between the conductive contact plug and each of the second gate electrodes, the first insulation pattern covering a sidewall of the conductive contact plug.

3. The vertical memory device of claim 1, further comprising:
    a common source line (CSL) on the substrate, the CSL extending through the gate electrodes in the second direction.

4. The vertical memory device of claim 3, wherein the conductive contact plug and the CSL include substantially a same material.

5. The vertical memory device of claim 4, wherein the gate electrodes, the conductive contact plug and the CSL include substantially the same material.

6. The vertical memory device of claim 3, further comprising:
a second insulation pattern between the CSL and each of the gate electrodes, the second insulation pattern covering a sidewall of the CSL.

7. The vertical memory device of claim 3, further comprising:
a circuit pattern on the substrate;
an insulating interlayer on the substrate, the insulating interlayer covering the circuit pattern, the conductive contact plug at least partially extending through the insulating interlayer to electrically connect to the circuit pattern; and
a base pattern on the insulating interlayer, the base pattern having the gate electrodes and the channel formed thereon.

8. The vertical memory device of claim 7, wherein the base pattern includes silicon.

9. The vertical memory device of claim 7, wherein the substrate includes:
a cell array region at a central portion of the substrate in the second direction, the cell array region having the channel and the CSL formed thereon; and
a pad region at edge portions of the substrate in the second direction, the pad region having pads of the gate electrodes and the conductive contact plug formed thereon.

10. The vertical memory device of claim 9, wherein the base pattern is formed only on the cell array region of the substrate.

11. A vertical memory device, comprising:
a circuit pattern on a substrate, the substrate having a memory cell region including a cell array region and a pad region such that the circuit pattern is vertically stacked below the memory cell region in a first direction substantially vertical to an upper surface of the substrate;
an insulating interlayer covering the circuit pattern;
a base pattern on the insulating interlayer on the cell array region of the substrate;
gate electrodes spaced apart from each other on the base pattern and the insulating interlayer in the first direction such that the gate electrodes are stacked in the first direction from a lowermost level to an uppermost level;
a channel extending through the gate electrodes on the cell array region of the substrate; and
a conductive contact plug extending through each of the gate electrodes and the insulating interlayer on the pad region of the substrate such that the conductive contact plug is electrically connected to one of the gate electrodes and the circuit pattern and the one of the gate electrodes electrically connected to the circuit pattern via the conductive contact plug is an uppermost one of the gate electrodes at the uppermost level and each of the gate electrodes therebelow are electrically insulated from the circuit pattern.

12. The vertical memory device of claim 11, wherein each of the gate electrodes includes a pad on the pad region of the substrate, a thickness of the pad of at least one of the gate electrodes being greater than those of other portions of the at least one of the gate electrodes.

13. The vertical memory device of claim 12, wherein an upper surface of the pad of the at least one of the gate electrodes is higher than other portions of the at least one of the gate electrodes in relation to the substrate.

14. The vertical memory device of claim 12, wherein the conductive contact plug is electrically connected to one of the gate electrodes through the pad thereof.

15. The vertical memory device of claim 11, wherein the conductive contact plug includes:
a first extension portion extending in the first direction; and
a second extension portion connected to the first extension portion, the second extension portion covering a sidewall of the first extension portion and extending in a second direction, the second direction being substantially parallel to the upper surface of the substrate.

16. The vertical memory device of claim 11, wherein the conductive contact plug is electrically insulated by an insulation pattern from ones of the gate electrodes disposed under the one of the gate electrodes that is electrically connected to the conductive contact plug.

17. A vertical memory device, comprising:
gate electrodes on a substrate, the gate electrodes being stacked in a first direction substantially perpendicular to an upper surface of the substrate, and a first portion of each of the gate electrodes having a thickness greater than a thickness of other portions thereof;
a channel extending through the gate electrodes in the first direction; and
conductive contact plugs each extending through the first portion of a corresponding one of the gate electrodes and other ones of the gate electrodes under the corresponding one of the gate electrodes such that the conductive contact plugs are electrically connected to the corresponding one of the gate electrodes and electrically insulated from the other ones of the gate electrodes, bottom surfaces of the conductive contact plugs being lower than a bottom surface of a lowermost one of the other ones of the gate electrodes.

18. The vertical memory device of claim 17, wherein the first portion of each of the gate electrodes is at an end portion thereof, and an upper surface of the first portion is higher than other portions of the gate electrodes.

19. The vertical memory device of claim 18, wherein the corresponding one of the gate electrodes electrically connected to the conductive contact plugs are an uppermost one of the gate electrodes through which each of the conductive contact plugs extends.

* * * * *